United States Patent
Chuang et al.

(10) Patent No.: US 10,878,928 B2
(45) Date of Patent: Dec. 29, 2020

(54) ONE-TIME-PROGRAMMABLE (OTP) IMPLEMENTATION USING MAGNETIC JUNCTIONS

(71) Applicant: Taiwan Semiconductor Manufacturing Co., Ltd., Hsin-Chu (TW)

(72) Inventors: Harry-Hak-Lay Chuang, Zhubei (TW); Tien-Wei Chiang, Taipei (TW); Wen-Chun You, Dongshan Township (TW); Yi-Chieh Chiu, Taipei (TW); Yu-Lin Chen, Tainan (TW); Jian-Cheng Huang, Hsinchu (TW); Chang-Hung Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/410,308

(22) Filed: May 13, 2019

(65) Prior Publication Data
US 2020/0098440 A1 Mar. 26, 2020

Related U.S. Application Data

(60) Provisional application No. 62/734,620, filed on Sep. 21, 2018.

(51) Int. Cl.
*G11C 17/16* (2006.01)
*G11C 17/18* (2006.01)
(Continued)

(52) U.S. Cl.
CPC .............. *G11C 17/16* (2013.01); *G11C 17/18* (2013.01); *H01L 27/228* (2013.01); *H01L 43/02* (2013.01); *H01L 43/12* (2013.01)

(58) Field of Classification Search
CPC ....... G11C 17/16; G11C 17/18; H01L 27/228; H01L 43/02; H01L 43/12
See application file for complete search history.

(56) References Cited

U.S. PATENT DOCUMENTS 9,614,144 B1 * 4/2017 Annunziata ............ H01L 43/12
9,805,816 B2 10/2017 Jan et al.
(Continued)

FOREIGN PATENT DOCUMENTS

KR 20170045081 A 4/2017

OTHER PUBLICATIONS

Yang et al. "Exploiting Spin-Orbit Torque Devices as Reconfigurable Logic for Circuit Obfuscation." IEEE Transactions on Computer-Aided Design of Integrated Circuits and Systems, Feb. 2018.

Primary Examiner — Tri M Hoang
(74) Attorney, Agent, or Firm — Eschweiler & Potashnik, LLC

(57) ABSTRACT

Various embodiments of the present application are directed towards a one-time-programmable (OTP) implementation using magnetic junctions. In some embodiments, an array comprises multiple magnetic junctions in multiple columns and multiple rows, and the magnetic junctions comprise a first magnetic junction and a second magnetic junction. The first and second magnetic junctions comprise individual top ferromagnetic elements and individual bottom ferromagnetic elements, and further comprise individual barrier elements between the top and bottom ferromagnetic elements. A first barrier element of the first magnetic junction electrically separates first top and bottom ferromagnetic elements of the first magnetic junction. A second barrier element of the second magnetic junction has undergone breakdown, such that it has defects defining a leakage path between second top and bottom ferromagnetic elements of the second magnetic junction. The broken-down state corresponds to a (Continued)

one-time programmed state and is not susceptible to high-temperature change, even at small sizes.

20 Claims, 19 Drawing Sheets

(51) Int. Cl.
*H01L 27/22* (2006.01)
*H01L 43/02* (2006.01)
*H01L 43/12* (2006.01)

(56) References Cited

U.S. PATENT DOCUMENTS

| | | |
|---|---|---|
| 10,210,920 B1* | 2/2019 | Chen ..................... G11C 17/16 |
| 2013/0070519 A1 | 3/2013 | Lin et al. |
| 2017/0110171 A1* | 4/2017 | Seo ..................... G11C 11/1673 |

* cited by examiner

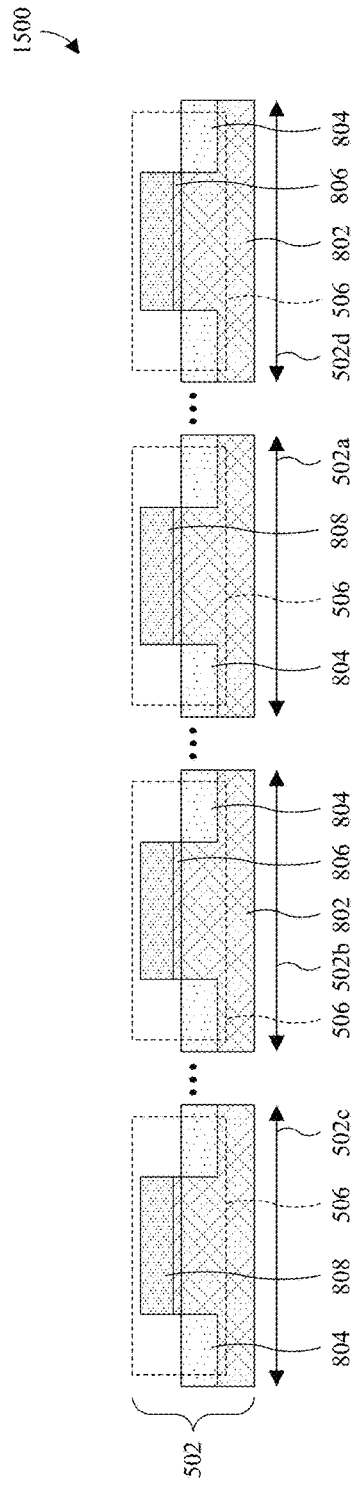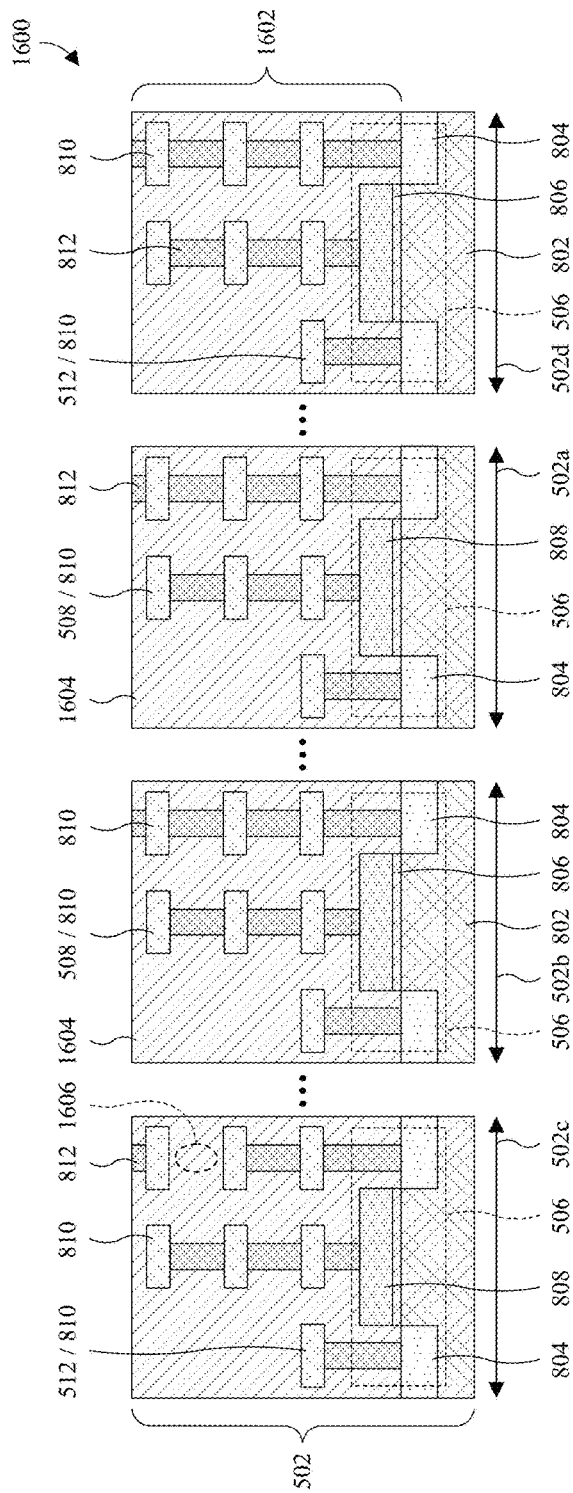
Fig. 15
Fig. 16

ONE-TIME-PROGRAMMABLE (OTP) IMPLEMENTATION USING MAGNETIC JUNCTIONS

REFERENCE TO RELATED APPLICATION

This Application claims the benefit of U.S. Provisional Application No. 62/734,620, filed on Sep. 21, 2018, the contents of which are hereby incorporated by reference in their entirety.

BACKGROUND

Many modern electronic devices include non-volatile memory. Non-volatile memory is memory that retains data in the absence of power. Non-volatile memory includes one-time-programmable (OTP) memory and magnetoresistive random-access memory (MRAM). OTP memory is read-only memory that may only be programmed once. MRAM is a promising candidate for next generation non-volatile memory. An MRAM cell stores data using a magnetic junction, which comprises a barrier layer between two ferromagnetic elements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15-19 illustrate a series of cross-sectional views of some embodiments of a method for forming an integrated chip comprising a memory array with an MTP portion, an OTP portion, a dummy portion, and a reference portion is provided.

DETAILED DESCRIPTION

Figure 1:
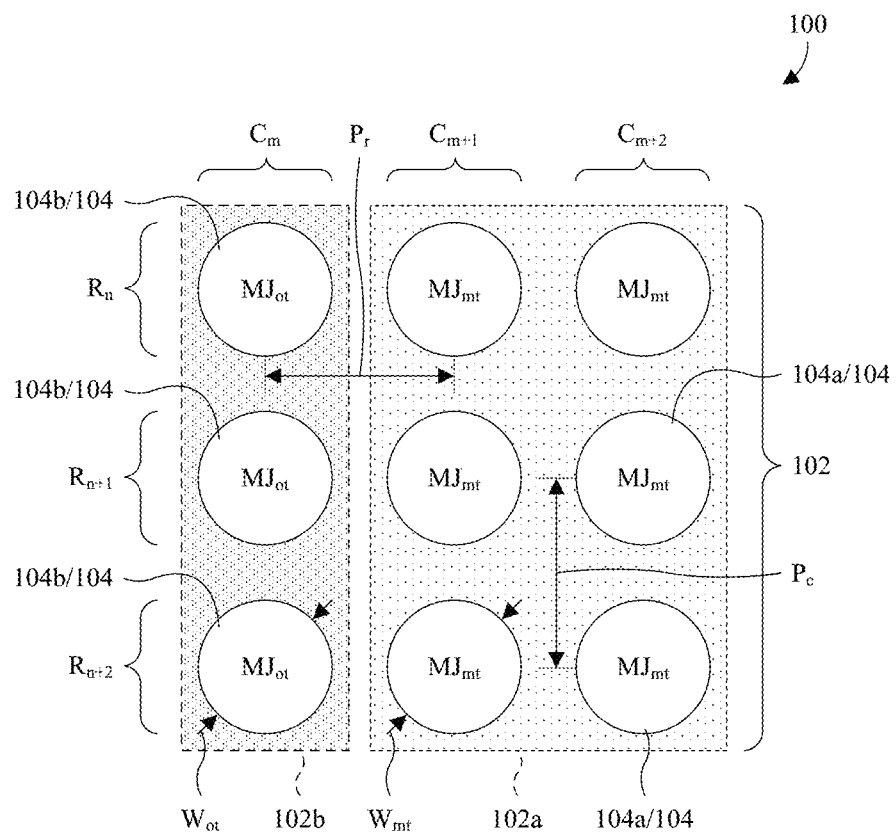
FIG. 1 illustrates a top layout of some embodiments of an integrated chip comprising a magnetic-junction array with a multi-time-programmable (MTP) portion and a one-time-programmable (OTP) portion.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) may comprise a magnetoresistive random-access memory (MRAM) array and a one-time-programmable (OTP) memory array. In some embodiments, the OTP memory array is formed separate from the MRAM array. However, this leads to high costs and increases process complexity. In other embodiments, the OTP memory array is formed as an OTP portion of the MRAM array, which is write-locked by fuses, antifuses, write circuitry, or any combination of the foregoing.

When the OTP memory array is formed as the OTP portion of the MRAM array, magnetic junctions of the MRAM array typically have the same size, regardless of whether in the OTP portion of the MRAM array or multi-time-programmable (MTP) portion of the MRAM array. Further, the magnetic junctions of the MRAM array typically have uniform or substantially uniform pitches throughout the MRAM array, regardless of whether in the OTP portion of the MRAM array or the MTP portion of the MRAM array. To form the magnetic junctions with different sizes and/or pitches leads to process complexity and reduces the process window, such that yields decrease. However, where the magnetic junctions of the MRAM array are constrained to the same size and pitches, as above, challenges arise.

Small magnetic junctions are unable to retain stored data at high temperatures. A small magnetic junction may, for example, have a width less than or equal to about 75 nanometers. The high temperatures include temperatures greater than about 100 degrees Celsius and may, for example, arise during reflow (i.e., high temperature baking) used to bond the IC to a printed circuit board (PCB). Further, while large magnetic junctions are able to retain stored data at the high temperatures, the large magnetic junctions aren't scalable and lead to large access transistors due to high current consumption. A large magnetic junction may, for example, have a width greater than about 75 nanometers. The large magnetic junctions and the large access transistors, in turn, lead to large cell pitches throughout the MRAM array.

Various embodiments of the present application are directed towards an OTP implementation using magnetic junctions. In some embodiments, an array comprises a plurality of magnetic junctions in a plurality of columns and a plurality of rows, and the plurality of magnetic junctions comprises a first magnetic junction and a second magnetic junction. The first and second magnetic junctions comprise individual top ferromagnetic elements and individual bottom ferromagnetic elements, and further comprise individual barrier elements between the top and bottom ferromagnetic elements. A first barrier element of the first magnetic junction electrically separates first top and bottom ferromagnetic elements of the first magnetic junction. Depending upon whether the first top and bottom ferromagnetic elements are in a parallel state or an anti-parallel state, the first magnetic junction is in a first data state or a second data state. A second barrier element of the second magnetic junction has undergone breakdown, and hence has defects defining a leakage path between second top and bottom ferromagnetic elements of the second magnetic junction. The defects may, for example, correspond to a hard and/or permanent breakdown of the second barrier element.

Depending upon whether the second magnetic junction is in a broken-down state (as is the case here) or an unbroken-down state, the second magnetic junction is in a first data state or a second data state. Further, when the breakdown is permanent, the second magnetic junction is OTP and not susceptible to a change in state at high temperatures (e.g., temperatures at reflow), even at small size. Hence, the broken-down state of magnetic junctions may be used to form OTP memory cells that can be scaled to small sizes and that are not susceptible to high temperatures. Further, using the broken-down state of magnetic junctions leads to a large read window, such that the OTP memory cells are less susceptible to non-uniformity. This, in turn, allows the OTP memory cells to be placed at an edge of the array with and/or in place of dummy cells. Dummy cells are unused memory cells that are typically placed at the edge of the array to offset regular memory cells from the edge since there is a high degree of non-uniformity at the edge that is detrimental to reliable operation of regular memory cells.

With reference to FIG. 1, a top layout 100 of some embodiments of an integrated chip comprising a magnetic-junction array 102 is provided. In some embodiments, only a portion of the magnetic-junction array 102 is illustrated in the top layout 100. The magnetic-junction array 102 comprises multiple magnetic junctions 104 distributed amongst an MTP portion 102a of the magnetic-junction array 102 and an OTP portion 102b of the magnetic-junction array 102. For ease of illustration, only some of the magnetic junctions 104 are labeled 104. In some embodiments, the OTP portion 102b is at an edge of the magnetic-junction array 102.

The magnetic junctions 104 are in a plurality of columns and a plurality of rows. The plurality of columns includes column $C_m$, column $C_{m+1}$, and column $C_{m+2}$, where m is an integer variable representing a column number. The plurality of rows includes row $R_n$, row $R_{n+1}$, and row $R_{n+2}$, where n is an integer variable representing a row number. The magnetic junctions 104 comprise individual reference elements (not shown) and individual free elements (not shown), and further comprise individual barrier elements (not shown) sandwiched between the individual reference and free elements. The magnetic junctions 104 may, for example, be or comprise magnetic tunnel junctions (MTJs), spin valves, or some other suitable magnetic junctions.

Magnetic junctions 104a in the MTP portion 102a (i.e., MTP magnetic junctions 104a) each store a bit of data, the state of which varies depending upon magnetizations of individual reference and free elements. For example, an MTP magnetic junction may have a low resistance (corresponding to a first data state) when magnetizations of individual reference and free elements are parallel and may have a high resistance (corresponding to a second data state) when magnetizations of the individual reference and free elements are anti-parallel. Further, the MTP magnetic junctions 104a may each be programmed and erased multiple times by changing magnetizations of the individual free elements relative to those of the individual reference elements. Accordingly, the MTP magnetic junctions 104a may be used for MRAM. For ease of illustration, only some of the MTP magnetic junctions 104a are labeled 104a.

Magnetic junctions 104b in the OTP portion 102b (i.e., OTP magnetic junctions 104b) each store a bit of data, the state of which depends upon whether an individual barrier element has undergone breakdown. For example, an OTP magnetic junction 104b may have a first data state when an individual barrier element has undergone breakdown and a second data state otherwise. Breakdown leads to defects in an individual barrier element, whereby leakage current may flow between an individual reference element and an individual free element. Therefore, an OTP magnetic junction 104b has a low resistance in the first data state and a high resistance in the second data state. Further, the OTP magnetic junctions 104b may each be programmed only once by breakdown of the individual barrier element. Breakdown may, for example, be permanent and/or irreversible. Accordingly, the OTP magnetic junctions 104b have low resistances once programmed and may hence be used as anti-fuses. For ease of illustration, only some of the OTP magnetic junctions 104b are labeled 104b.

By programming the OTP magnetic junctions 104b by breakdown, programmed states of the OTP magnetic junctions 104b may persist at high temperatures, even when the OTP magnetic junctions 104b are small. Accordingly, the magnetic-junction array 102 may be scaled down to small sizes and the OTP magnetic junctions 104b may still be used at high temperatures. The high temperatures may, for example, be other or otherwise include temperatures greater than or equal to about 100 or 125 degrees Celsius and/or may, for example, arise during reflow (i.e., high temperature baking) used to bond the integrated chip to a PCB. Other temperatures are, however, amenable. The OTP magnetic junctions 104b may, for example, be small when widths $W_{ot}$ of the OTP magnetic junctions 104b are less than or equal to about 75 nanometers, 70 nanometers, 60 nanometers, or some other suitable values. Further, by programming the OTP magnetic junctions 104b by breakdown, the difference between a read current of a programmed OTP magnetic junction and a read current of an unprogrammed OTP magnetic junction is large. The large difference allows states of the OTP magnetic junctions 104b to be reliably sensed and may, for example, be greater than or equal to about 8 microamps and/or may, for example, be between about 8-18 microamps. Other values are, however, amenable.

By forming the magnetic-junction array 102 with both the MTP portion 102a and the OTP portion 102b, the OTP portion 102b may be readily expanded or contracted for different chip configurations. For example, the OTP portion 102b may be electrically and/or dynamically expanded or contracted. Further, by forming the magnetic-junction array 102 with both the MTP portion 102a and the OTP portion 102b, an MTP array and an OTP array may be formed simultaneously. This, in turn, reduces manufacturing costs and process complexity compared to separately forming an MTP array and an OTP array. Further yet, by forming the magnetic-junction array 102 with both the MTP portion 102a and the OTP portion 102b, chip area is reduced compared to separately forming an MTP array and an OTP array.

In some embodiments, the magnetic junctions 104 share a common size, regardless of whether in the MTP portion 102a or the OTP portion 102b. For example, the widths $W_{ot}$ of the OTP magnetic junctions 104b may be the same as widths $W_{mt}$ of the MTP magnetic junctions 104a. In some embodiments, a row-wise pitch $P_r$ of the magnetic-junction array 102 is uniform throughout the magnetic-junction array 102, regardless of whether at and/or between the MTP portion 102a and the OTP portion 102b. Similarly, in some embodiments, a column-wise pitch $P_c$ of the magnetic-junction array 102 is uniform throughout the magnetic-junction array 102, regardless of whether at and/or between the MTP portion 102a and the OTP portion 102b.

As the widths $W_{ot}$ of the OTP magnetic junctions 104b shrink, the individual barrier elements of the OTP magnetic junctions 104b may be broken down with less current. Due to the reduced current, access transistors (not shown) associated with the magnetic junctions 104 may be reduced in size. Due to the reduced size of the magnetic junctions 104 and the reduced size of the access transistors, the row-wise pitch $P_r$ and the column-wise pitch $P_c$ may be reduced. Further, the chip area of the magnetic-junction array 102 may be reduced. Due to the reduced chip area, more units of the the integrated chip may be produced per wafer and/or the integrated chip may include more circuit components per unit area.

In some embodiments, the OTP magnetic junctions at row $R_n$ and row $R_{n+2}$ are in the broken-down state, and the OTP magnetic junction at row $R_{n+1}$ is in the unbroken-down state, or vice versa. In some embodiments, the OTP magnetic junctions at row $R_n$ and row $R_{n+1}$ are in the broken-down state, and the OTP magnetic junction at row $R_{n+2}$ is in the unbroken-down state, or vice versa. In some embodiments, the OTP magnetic junctions at row $R_{n+1}$ and row $R_{n+2}$ are in the broken-down state, and the OTP magnetic junction at row $R_n$ is in the unbroken-down state, or vice versa. In some embodiments, the OTP magnetic junctions at rows $R_n$ through $R_{n+2}$ have the same state (e.g., the broken-down state or the unbroken-down state).

Figure 2A:
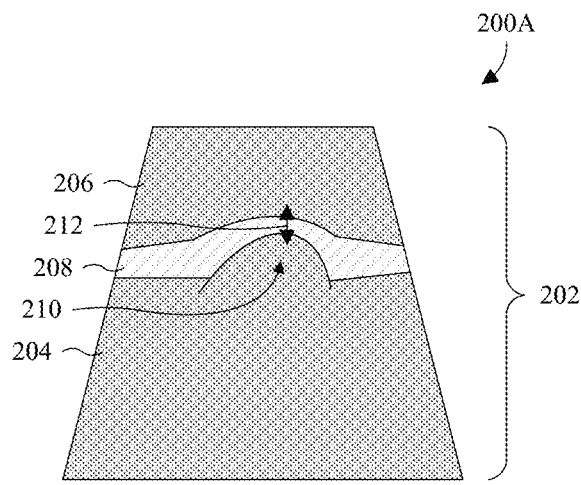
FIGS. 2A and 2B illustrate cross-sectional views of various embodiments of a broken-down magnetic junction in the OTP portion of FIG. 1.
Figure 2B:
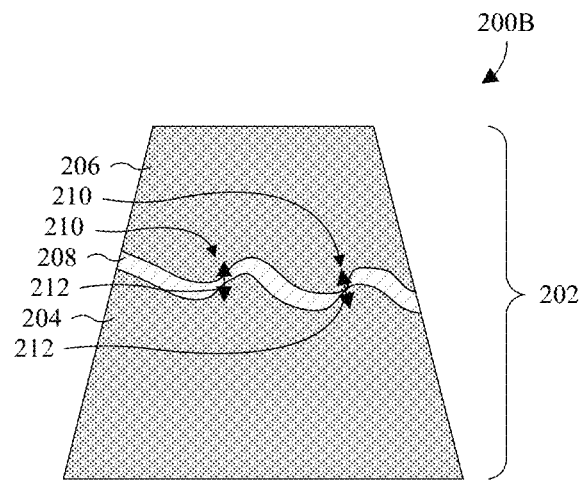

With reference to FIGS. 2A and 2B, cross-sectional views 200A, 200B of various embodiments of a broken-down magnetic junction 202 in FIG. 1 is provided. The broken-down magnetic junction 202 may, for example, be representative of each programmed OTP magnetic junction in FIG. 1 and/or may, for example, be an MTJ, a spin valve, or some other suitable magnetic junction. The broken-down magnetic junction 202 comprises a reference element 204, a free element 206, and a barrier element 208. The barrier element 208 is non-magnetic and is sandwiched between the reference and free elements 204, 206. The reference and free elements 204, 206 are ferromagnetic. Further, the reference element 204 has a fixed magnetization, whereas the free element 206 has a magnetization that is "free" to change.

The broken-down magnetic junction 202 has an abnormal structure compared to that of an unbroken-down magnetic junction. As part of the abnormal structure, the barrier element 208 comprises one or more defects 210 defining one or more leakage paths 212 from the reference element 204 to the free element 206. The defect(s) 210 may, for example, be or comprise carrier traps, conductive filaments, some other suitable defect(s), or any combination of the foregoing in the barrier element 208.

As illustrated by the cross-sectional view 200A of FIG. 2A, the barrier element 208 is missing material at a location where the reference element 204 bulges upward. Further, a leakage path 212 extends between the reference and free elements 204, 206 at the bulge. The barrier element 208 may, for example, be missing material and/or have the leakage path 212 due to a hard breakdown. As such, a defect 210 defining the leakage path 212 may, for example, be or comprise a conductive filament in the barrier element 208.

As illustrated by the cross-sectional view 200B of FIG. 2B, the barrier element 208 is twisted, thereby resulting in a non-uniform thickness. Further, leakage paths 212 extend between the reference and free elements 204, 206 at thin regions of the barrier element 208. The barrier element 208 may, for example, be twisted and/or have the leakage paths 212 due to a soft breakdown. As such, defects 210 defining the leakage paths 212 may, for example, be or comprise carrier traps in the barrier element 208.

In some embodiments, the barrier element 208 is a tunnel barrier selectively allowing quantum mechanical tunneling of electrons through the barrier element 208. For example, quantum mechanical tunneling may be allowed when the reference and free elements 204, 206 have parallel magnetizations, and may be blocked when the reference and free elements 204, 206 have antiparallel magnetizations. The barrier element 208 may, for example, be or comprise an amorphous barrier, a crystalline barrier, or some other suitable insulating and/or tunnel barrier material. The amorphous barrier may be or comprise, for example, aluminum oxide (e.g., $AlO_x$), titanium oxide (e.g., $TiO_x$), or some other suitable amorphous barrier. The crystalline barrier may be or comprise manganese oxide (e.g., MgO), spinel (e.g., $MgAl_2O_4$), or some other suitable crystalline barrier. Alternatively (e.g., where the broken-down magnetic junction 202 is a spin valve), the barrier element 208 may be or comprise, for example, a non-magnetic metal or some other suitable barrier. Examples of non-magnetic metals include copper, gold, silver, aluminum, lead, tin, titanium, zinc, brass, bronze, or other suitable non-magnetic metal(s).

In some embodiments, the reference element 204 is or comprises cobalt iron (e.g., CoFe), cobalt iron boron (e.g., CoFeB), or some other suitable ferromagnetic material(s), or any combination of the foregoing. In some embodiments, the reference element 204 adjoins an antiferromagnetic element (not shown) and/or is part of or otherwise adjoins a synthetic antiferromagnetic (SAF) element (not shown). In some embodiments, the free element 206 is or comprises cobalt iron (e.g., CoFe), cobalt iron boron (e.g., CoFeB), or some other suitable ferromagnetic material(s), or any combination of the foregoing.

Figure 3:
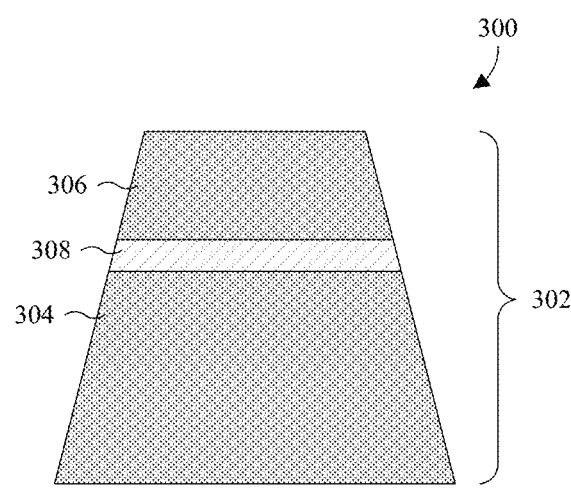
FIG. 3 illustrates a cross-sectional view of some embodiments of an unbroken-down magnetic junction in the MTP or OTP portion FIG. 1.

With reference to FIG. 3, a cross-sectional view 300 of some embodiments of an unbroken-down magnetic junction 302 in FIG. 1 is provided. The unbroken-down magnetic junction 302 may, for example, be representative of each of the MTP magnetic junctions 104a in FIG. 1 and/or each un-programmed OTP magnetic junction in FIG. 1. Further, the unbroken-down magnetic junction 302 may, for example, be an MTJ, a spin valve, or some other suitable magnetic junction. The unbroken-down magnetic junction 302 comprises a reference element 304, a free element 306, and a barrier element 308. The barrier element 308 is non-magnetic and is sandwiched between the reference and free elements 304, 306. In contrast with the barrier element 208 in FIGS. 2A and 2B, the barrier element 308 is free of or substantially free of defects and has a uniform or substantially uniform thickness. The reference and free elements 304, 306 are ferromagnetic. Further, the reference element 304 has a fixed magnetization, whereas the free element 306 has a magnetization that is "free" to change.

In some embodiments, the barrier element 308 is a tunnel barrier selectively allowing quantum mechanical tunneling of electrons through the barrier element 308. In some embodiments, the barrier element 308 has the same or substantially the same material composition as the barrier element 208 of FIGS. 2A and 2B.

In some embodiments, the reference element 304 adjoins an antiferromagnetic element (not shown). In some embodiments, the reference element 304 is part of or otherwise adjoins a SAF element (not shown). In some embodiments, the reference element 304 has the same or substantially the same material composition as the reference element 204 of FIGS. 2A and 2B, and/or the free element 306 has the same or substantially the same material composition as the free element 306 of FIGS. 2A and 2B.

While FIGS. 2A and 2B illustrate the reference element 204 and the free element 206 as being respectively under and over the barrier element 208, the reference element 204 and the free element 206 may alternatively be respectively over and under the barrier element 208. Similarly, while FIG. 3 illustrate the reference element 304 and the free element 306 as being respectively under and over the barrier element 308, the reference element 304 and the free element 306 may alternatively be respectively over and under the barrier element 308.

Figure 4A:
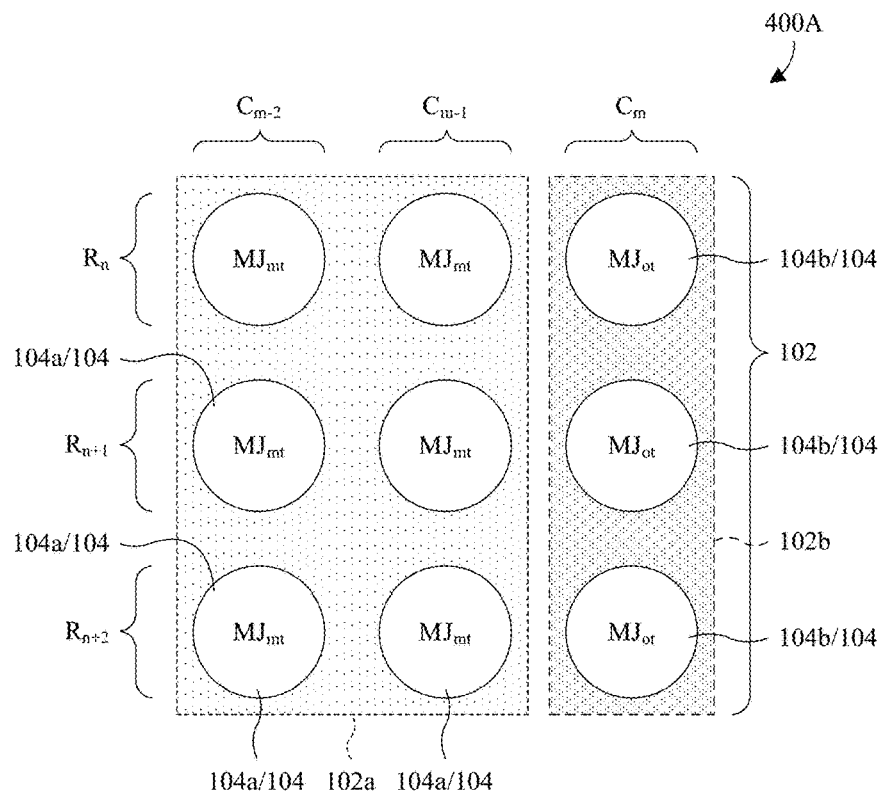
FIGS. 4A-4C illustrate top layouts of various alternative embodiments of the integrated chip of FIG. 1 in which a location of the OTP portion is varied.
Figure 4B:
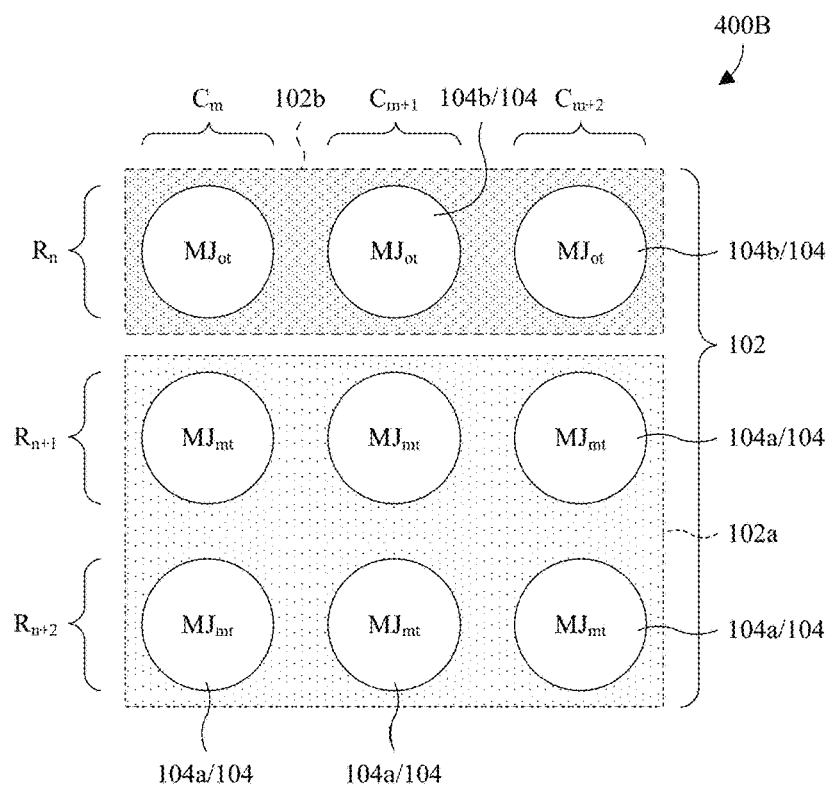
Figure 4C:
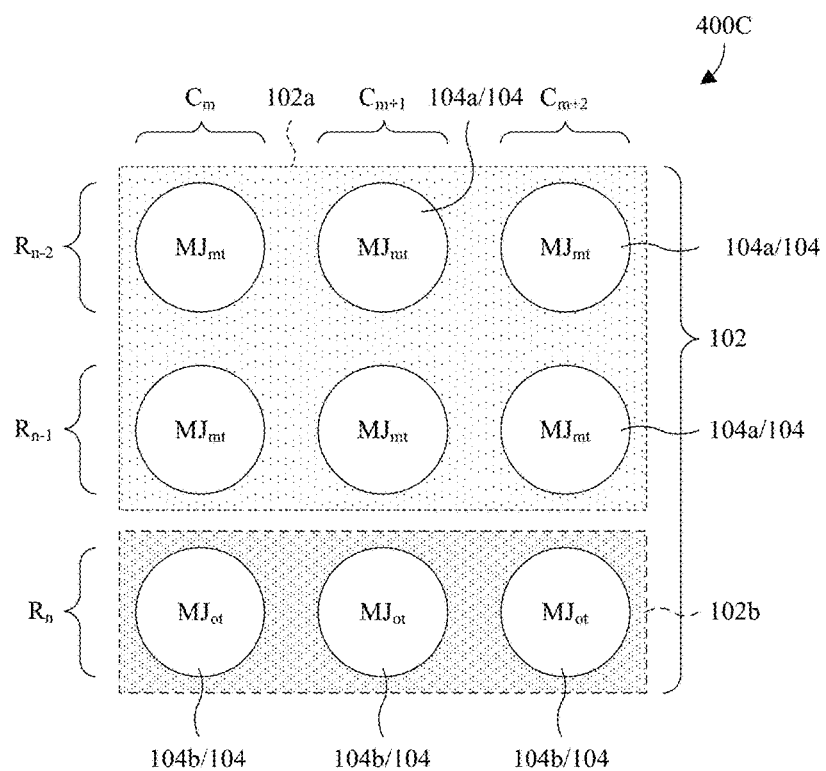

With reference to FIGS. 4A-4C, top layouts 400A-400C of various alternative embodiments of the integrated chip of FIG. 1 are provided in which a location of the OTP portion 102b of the magnetic-junction array 102 is varied. As illustrated by the top layout 400A of FIG. 4A, the OTP portion 102b is on a right side of the MTP portion 102a. As illustrated by the top layout 400B of FIG. 4B, the OTP portion 102b is over the MTP portion 102a. As illustrated by the top layout 400C of FIG. 4C, the OTP portion 102b is below the MTP portion 102a.

Figure 5:
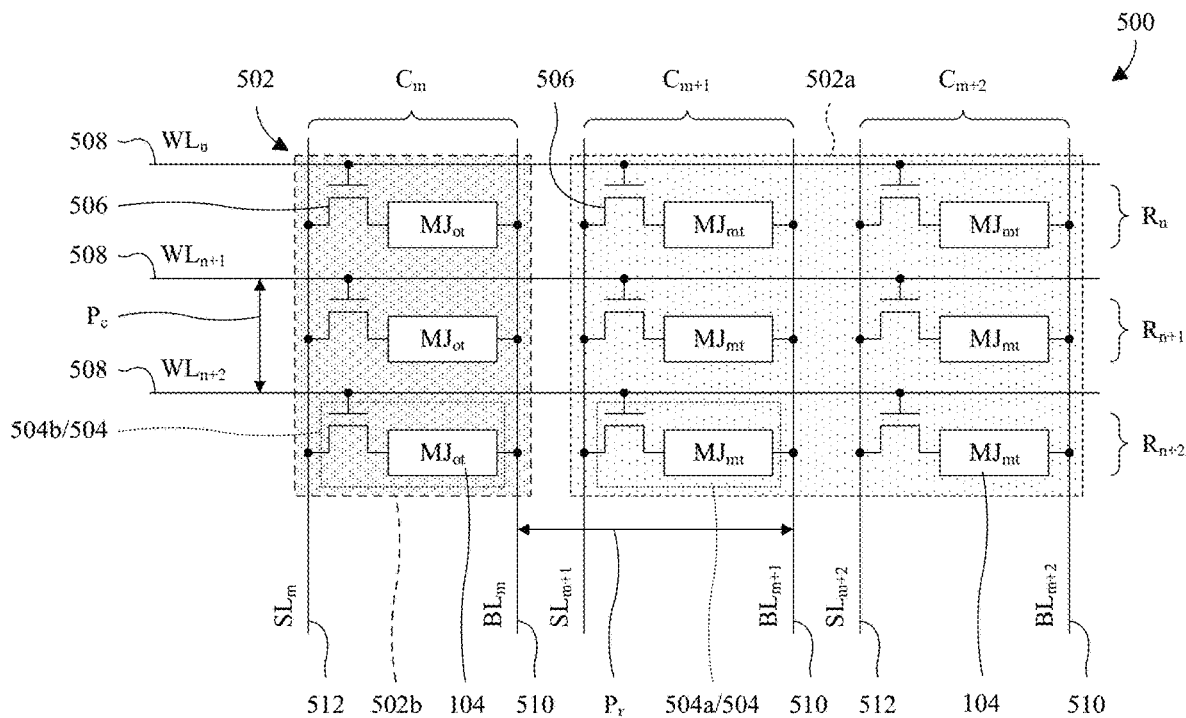
FIG. 5 illustrates a schematic diagram of some embodiments of an integrated chip comprising a memory array with the magnetic-junction array of FIG. 1.

With reference to FIG. 5, a schematic diagram 500 of some embodiments an integrated chip comprising a memory array 502 with the magnetic-junction array 102 of FIG. 1 is provided. In some embodiments, only a portion of the memory array 502 is illustrate. The memory array 502 comprises multiple memory cells 504 distributed amongst an MTP portion 502a of the memory array 502 and an OTP portion 502b of the memory array 502. For ease of illustration, only some of the memory cells 504 are labeled 504.

The memory cells 504 are in a plurality of columns and a plurality of rows. The plurality of columns includes column $C_m$, column $C_{m+1}$, and column $C_{m+2}$, where m is an integer variable representing a column number. The plurality of rows includes row $R_n$, row $R_{n+1}$, and row $R_{n+2}$, where n is an integer variable representing a row number. The memory cells 504 comprise individual access transistors 506 and individual magnetic junctions 104. For ease of illustration, only some of the access transistors 506 are labeled 506 and only some of the magnetic junctions 104 are labeled 104. The magnetic junctions 104 have variable resistances representing bits of data. The magnetic junctions 104 may, for example, be MTJs, spin valves, or some other suitable magnetic junctions. The access transistors 506 may, for example, be metal-oxide-semiconductor field-effect transistors (MOSFETs), some other suitable insulated-gate field-effect transistors (IGFETs), or some other suitable transistors.

Memory cells 504a in the MTP portion 502a (i.e., MTP memory cells 504a) each store a bit of data, the state of which varies depending upon magnetizations of an individual magnetic junction $MJ_{mt}$. For ease of illustration, only one of the MTP memory cells 504a is individually labeled 504a. Individual magnetic junctions $MJ_{mt}$ of the MTP memory cells 504a may, for example, be as the MTP magnetic junctions 104a are described with regard to FIG. 1, and/or as the unbroken-down magnetic junction 302 is illustrated and described in FIG. 3. In some embodiments, the MTP portion 502a of the memory array 502 comprises the MTP portion 102a of the magnetic-junction array 102 in FIG. 1.

Memory cells 504b in the OTP portion 502b (i.e., OTP memory cells 504b) each store a bit of data, the state of which varies depending upon whether an individual magnetic junction $MJ_{ot}$ has undergone breakdown. For ease of illustration, only one of the OTP memory cells 504b is individually labeled 504b. Individual magnetic junctions $MJ_{ot}$ of the OTP memory cells 504b may, for example, be as the OTP magnetic junctions 104b are described with regard to FIG. 1. Individual magnetic junctions of the OTP memory cells 504b in a first data state may, for example, be as the broken-down magnetic junction 202 is illustrated and described in any one of FIGS. 2A and 2B, whereas Individual magnetic junctions of the OTP memory cells 504b in a second data state may, for example, be as the unbroken-down magnetic junction 302 is illustrated and described in FIG. 3. In some embodiments, the OTP portion 502b of the memory array 502 comprises the OTP portion 102b of the magnetic-junction array 102 in FIG. 1.

A set of word lines 508 facilitates selection of the memory cells 504 on a row-by-row basis, whereas a set of bit lines 510 and a set of source lines 512 facilitate reading from and/or writing to selected memory cells on a column-by-column basis. For ease of illustration, only some of the bit lines 510 are labeled 510 and only some of the source lines 512 are labeled 512. The word lines 508 extend laterally along corresponding rows of the memory array 502 and electrically couple with gates of access transistors in the corresponding rows. The bit lines 510 extend laterally along corresponding columns of the memory array 502 and electrically couple with magnetic junctions in the corresponding columns. The source lines 512 extend laterally along corresponding columns of the memory array 502 and electrically couple with sources of access transistors in the corresponding columns.

In some embodiments, an OTP memory cell is programmed by biasing a corresponding bit line and a corresponding source line respectively with about 3.5V and 0V, and by further biasing a corresponding word line with about 2.4 volts. In some embodiments, an MTP memory cell is set to a parallel state by biasing a corresponding bit line and a corresponding source line respectively with about 1.8 volts and 0 volts, and by further biasing a corresponding word line with about 2.0 volts. In some embodiments, an MTP memory cells is set to an anti-parallel state by biasing a corresponding bit line and a corresponding source line respectively with about 0 volts and about 1.4 volts, and by further biasing a corresponding word line with about 2.4 volts. Other voltages may, however, be used to program an OTP memory cell and/or to set an MTP memory cell to a parallel or anti-parallel state.

In some embodiments, the memory cells 504 share a common size, regardless of whether in the MTP portion 502a or the OTP portion 502b. In some embodiments, a row-wise pitch $P_r$ of the memory array 502 is uniform throughout the memory array 502, regardless of whether at and/or between the MTP portion 502a and the OTP portion 502b. Similarly, in some embodiments, a column-wise pitch $P_c$ of the memory array 502 is uniform throughout the memory array 502, regardless of whether at and/or between the MTP portion 502a and the OTP portion 502b. The row-wise pitch $P_r$ may, for example, be 260 nanometers or less, and/or the column-wise pitch $P_c$ may, for example, be 220 nanometers or less, or vice versa. Other values for the row-wise pitch $P_r$ and/or the column-wise pitch $P_c$ is/are, however, amenable.

As the widths of the OTP magnetic junctions $MJ_{ot}$ shrink (see, e.g., $W_{ot}$ in FIG. 1), the individual barrier elements of the OTP magnetic junctions $M_{Jot}$ may be broken down with less current. Due to the reduced current, the access transistors 506 associated with the magnetic junctions 104 may be reduced in size. Due to the reduced size of the magnetic junctions 104 and the reduced size of the access transistors 506, the row-wise pitch $P_r$ and the column-wise pitch $P_c$ may be reduced. Further, the chip area of the memory array 502 may be reduced. Due to the reduce chip area, more units of the integrated chip may be produced per wafer and/or the integrated chip may include more circuit components per unit area.

Figure 6A:
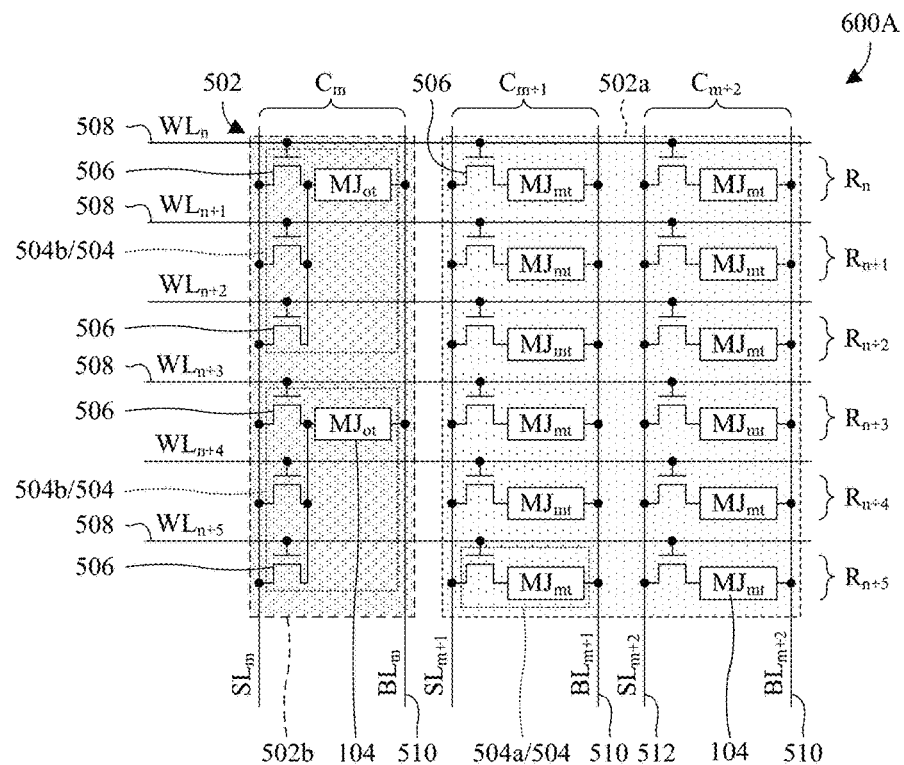
FIGS. 6A and 6B illustrate expanded schematic diagrams of various alternative embodiments of the integrated chip of FIG. 5 in which each memory cell comprises multiple access transistors.
Figure 6B:
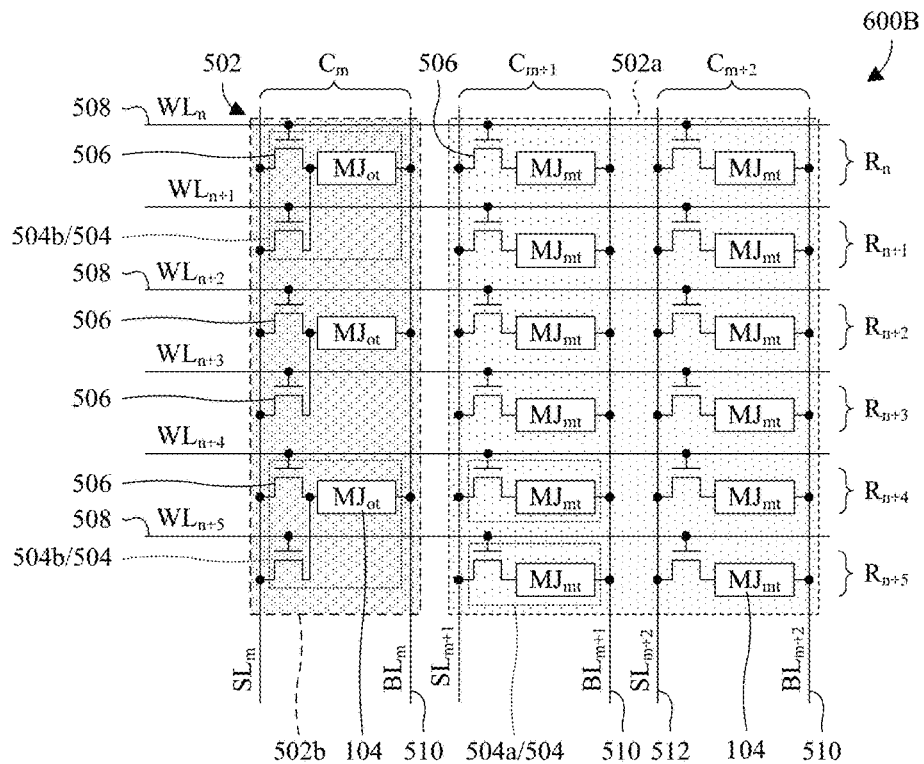

With reference to FIGS. 6A and 6B, expanded schematic diagrams 600A, 600B of various alternative embodiments of the integrated chip of FIG. 5 are provided in which the OTP memory cells 504b each comprises multiple access transistors 506. For example, as illustrated by the schematic diagram 600A of FIG. 6A, the OTP memory cells 504b may each have three access transistors. As another example, as illustrated by the schematic diagram 600B of FIG. 6B, the OTP memory cells 504b may each have two access transistors. As yet another example, the OTP memory cells 504b may each have four or more access transistors.

The multiple access transistors of an OTP memory cell are electrically coupled in parallel and span multiple rows. The multiple access transistors of an OTP memory cell enable more current to be driven through a magnetic junction of the OTP memory cell than if the OTP memory cell had only one access transistor. Programming a magnetic junction of an OTP memory cell may depend upon this increased current since programming is achieved by breakdown of the magnetic junction and such breakdown depends upon high current.

Figure 7:
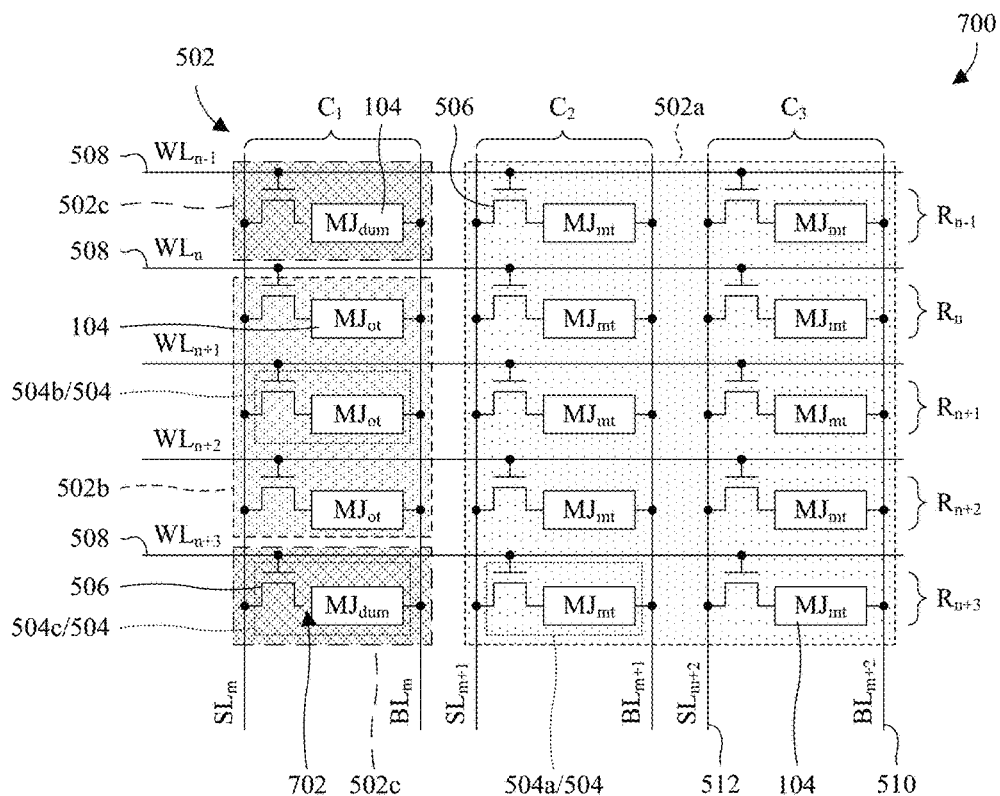
FIG. 7 illustrates an expanded schematic diagram of some embodiments of the integrated chip of FIG. 5 in which an OTP portion of the memory array is at an edge of the memory array and adjoins a dummy portion of the memory array.

With reference to FIG. 7, an expanded schematic diagram 700 of some alternative embodiments of the integrated chip of FIG. 5 is provided in which the OTP portion 502b is at an edge of the memory array 502 and adjoins a dummy portion 502c of the memory array 502. For example, the OTP portion 502b and the dummy portion 502c may both be at column $C_1$ of the memory array 502. Memory cells 504c in the dummy portion 502c (i.e., dummy memory cells 504c) are unused memory cells typically having poor uniformity. In some embodiments, the dummy memory cells 504c have the same structure as the MTP memory cells 504a. In other embodiments, the dummy memory cells 504c have magnetic junctions and access transistors that are electrically separated, as denoted by gaps 702. For ease of illustration, only one of the dummy memory cells 504c is labeled 504c and only one of the gaps 702 is labeled 702.

Memory cells at the edge of the memory array 502 suffer from non-uniformity due to a large change in feature density at the edge of the memory array 502. The large change in feature density causes non-uniformity in processes used to form the memory cells at the edge of the memory array 502, which causes the non-uniformity in the memory cells. For example, the large change in feature density may lead to thickness non-uniformity in material depositions, non-uniform chemical-mechanical planarization (CMP), non-uniform photolithography, and other non-uniformity in manufacturing processes. Hence, the dummy portion 502c serves as a buffer to prevent non-uniformity with memory cells offset from the edge of the memory array 502, such as, for example, the MTP memory cells 504a.

The read and write windows for MTP memory cells 504a are relatively small compared to the read and write windows for the OTP memory cells 504b. Hence, the MTP memory cells 504a are more sensitive to non-uniformity than the OTP memory cells 504b and placing the MTP memory cells 504a at the edge of the memory array 502 may result in poor yields. However, since the OTP memory cells 504b are less sensitive to non-uniformity than the MTP memory cells 504a, good yields may still be obtained with the OTP memory cells 504b at the edge of the memory array 502. Hence, placing the OTP memory cells 504b at the edge of the memory array 502 allows previously unused memory cells to be used and allows the functional density of the integrated chip to be increased. This, in turn, may reduce manufacturing costs.

While FIG. 5 is illustrated using embodiments of the magnetic-junction array 102 in FIG. 1, it is to be appreciated that embodiments of the magnetic-junction array 102 in any one of FIGS. 4A-4C may alternatively be used. Further, while FIGS. 5, 6A, 6B, and 7 illustrate the OTP portion 502b as being to the left of the MTP portion 502a, the OTP portion 502b may be above, below, or to the right of the MTP portion 502a in other embodiments.

Figure 8A:
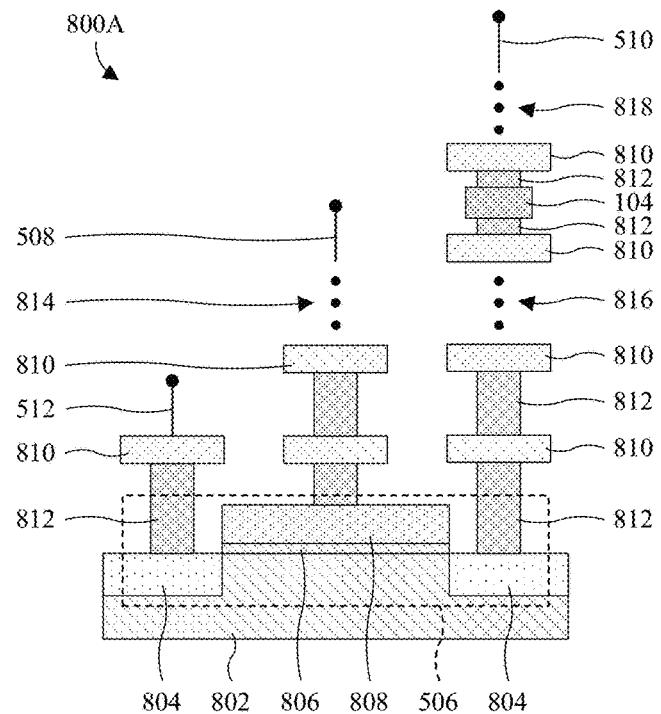
FIGS. 8A and 8B illustrate various cross-sectional views of some embodiments of a memory cell in FIG. 5.

With reference to FIG. 8A, a cross-sectional view 800A of some embodiments of a memory cell of FIG. 5 is provided. The memory cell comprises an access transistor 506 and a magnetic junction 104. The memory cell may, for example, be representative of each of the memory cells 504 of FIG. 5, regardless of whether an MTP memory cell, an OTP memory cell, or some other suitable memory cell.

The access transistor 506 is on a substrate 802 and comprises pair of source/drain regions 804, a gate dielectric layer 806, and a gate electrode 808. The source/drain regions 804 are in the substrate 802 and have an opposite doping type as adjoining portions of the substrate 802. The gate dielectric layer 806 overlies the substrate 802, and the gate electrode 808 overlies the gate dielectric layer 806. Further, the gate dielectric layer 806 and the gate electrode 808 are sandwiched between the source/drain regions 804. The substrate 802 may, for example, be a bulk silicon substrate, some other suitable bulk semiconductor substrate, a siliconon-insulator (SOI) substrate, or some other suitable substrate. The access transistor 506 may, for example, be a MOSFET, an IGFET, or some other suitable transistor.

Multiple wires 810 and multiple vias 812 are alternatively stacked over the access transistor 506 to define conductive paths. For ease of illustration, only some of the wires 810 are labeled 810 and only some of the vias 812 are labeled 812. The wires 810 and the vias 812 define a first conductive path from a first one of the source/drain regions 804 to a source line 512, and a second conductive path from the gate electrode 808 to a word line 508. A first ellipsis 814 along the second conductive path may, for example, represent zero or more vias and zero or more wires. Further, the wires 810 and the vias 812 define a third conductive path from a second one of the source/drain regions 804 to a bottom of the magnetic junction 104, and a fourth conductive path from a top of the magnetic junction 104 to a bit line 510. A second ellipsis 816 along the third conductive path may, for example, represent one or more vias and zero or more wires. Similarly, a third ellipsis 818 along the fourth conductive path may, for example, represent zero or more vias and zero or more wires.

In some embodiments, the magnetic junction 104 is an MTJ, a spin valve, or some other suitable magnetic junction. In some embodiments, the magnetic junction 104 is as the magnetic junction 202 in either one of FIG. 2A or 2B is illustrated and described. For example, where the memory cell is an OTP memory cell that is programmed, the magnetic junction 104 may be as the magnetic junction 202 in either one of FIG. 2A or 2B is illustrated and described. In some embodiments, the magnetic junction 104 is as the magnetic junction 302 in FIG. 3 is illustrated and described. For example, where the memory cell is an OTP memory cell that is unprogrammed, the magnetic junction 104 may be as the magnetic junction 302 in FIG. 3 is illustrated and described. As another example, where the memory cell is an MTP memory cell, regardless of whether programmed or unprogrammed, the magnetic junction 104 may be as the magnetic junction 302 in FIG. 3 is illustrated and described.

Figure 8B:
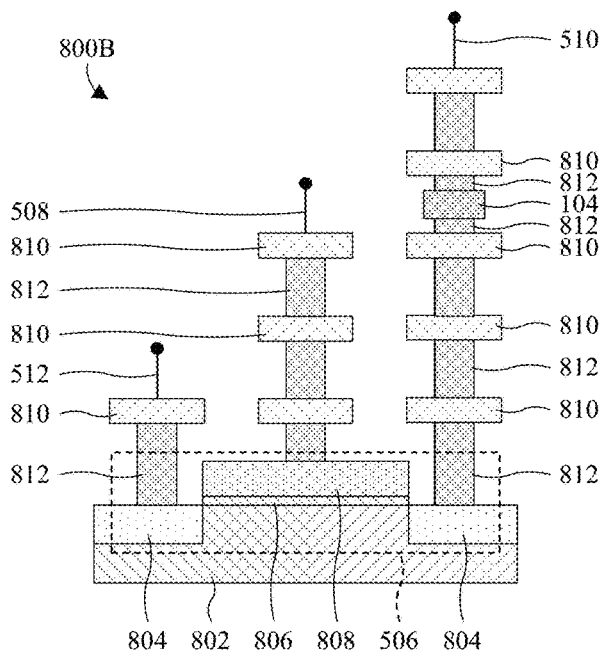

With reference to FIG. 8B, a cross-sectional view 800B of some more detailed embodiments of the memory cell of FIG. 8A is provided in which the first, second, and third ellipses 814, 816, 818 have been replaced. The first ellipsis has been replaced by a wire and a via. The second ellipsis has been replaced by a via. The third ellipsis has been replaced by a wire and a via. Accordingly, the source line 512 may, for example, be at a first metallization layer, and/or the word line 508 may, for example, be at a third metallization layer. Further, the magnetic junction 104 may, for example, be between a third metallization layer and a fourth metallization layer, and/or the bit line 510 may, for example, be at a fifth metallization layer.

Figure 9A:
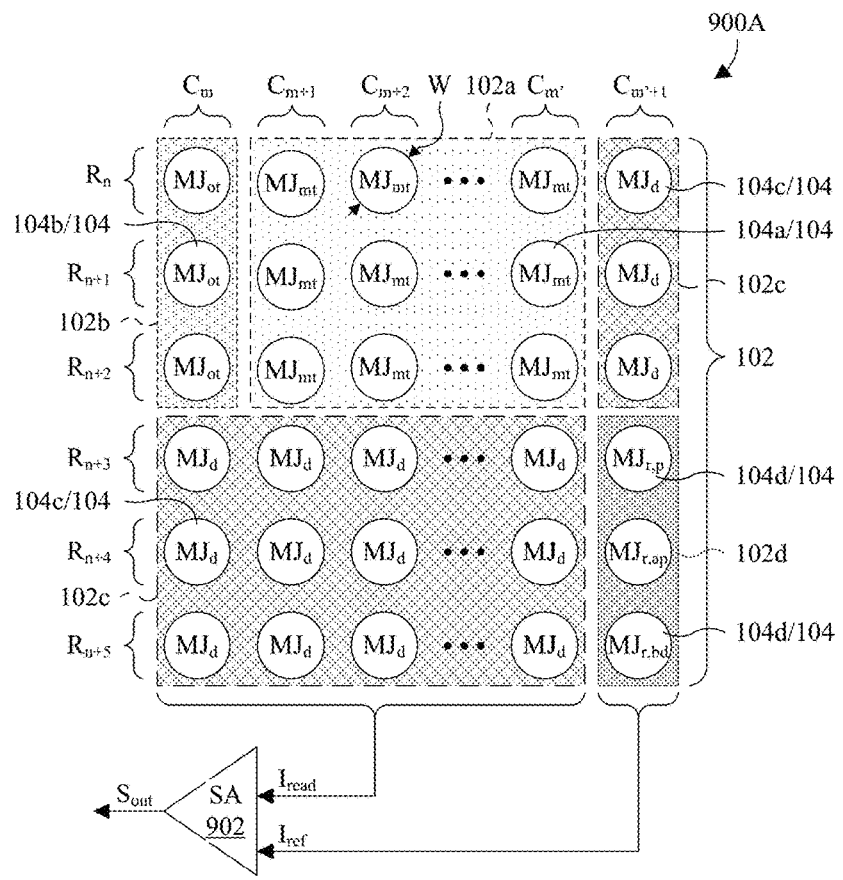
FIGS. 9A and 9B illustrate expanded top layouts of various embodiments of the integrated chip of FIG. 1 in which the magnetic-junction array further has a reference portion.

With reference to FIG. 9A, an expanded top layout 900A of some embodiments of the integrated chip of FIG. 1 is provided in which the magnetic-junction array 102 further comprises a dummy portion 102c and a reference portion 102d. The dummy portion 102c is above the reference portion 102d in column $C_{m'+1}$ and is to the side of the reference portion 102d in columns $C_m$ to $C_{m'}$. $C_m$ and $C_{m'}$ are integer variables representing column numbers. Magnetic junctions 104c in the dummy portion 102c (i.e., dummy magnetic junctions 104c) are unused. For ease of illustration, only some of the dummy magnetic junctions 104c are labeled 104c. As seen hereafter, the dummy magnetic junctions 104c may, for example, be unused due to the layout of word lines and bit lines interconnecting the magnetic junctions 104 in a memory array. Magnetic junctions 104d in the reference portion 102d (i.e., reference magnetic junctions 104d) correspond to the various states of the MTP and OTP magnetic junctions 104a, 104b. For ease of illustration, only some of the reference magnetic junctions 104d are labeled 104d.

The reference magnetic junctions 104d comprise a reference magnetic junction $MJ_{r,p}$ with individual free and reference elements (not shown) in a parallel state, and further comprise a reference magnetic junction $MJ_{r,ap}$ with individual free and reference elements in an antiparallel state. The parallel state may, for example, correspond to a first data state of the MTP magnetic junctions 104a, whereas the antiparallel state may, for example, correspond to a second data state of the MTP magnetic junctions 104a. The reference magnetic junctions 104d further comprise a reference magnetic junction $MJ_{r,bd}$ with in a broken-down state in which an individual barrier element that has undergone breakdown (e.g., hard and/or irreversible breakdown). The broken-down state may, for example, correspond to a first data state of the OTP magnetic junctions 104b, whereas the parallel and/or antiparallel states may, for example, correspond to a second data state of the OTP magnetic junctions 104b.

Depending upon the data state of the magnetic junctions 104, the resistances of the magnetic junctions vary. For example, an MTP magnetic junction has a first resistance in the parallel state and a second resistance in the anti-parallel state. As another example, an OTP magnetic has a first resistance in the broken-down state and a second resistance in the unbroken-down state. Hence, to read the data state of an individual magnetic junction, regardless of whether an OTP magnetic junction or an MTP magnetic junction, a read voltage is applied across the magnetic junction to generate a read current $I_{read}$. The read current $I_{read}$ is then compared to a reference current $I_{ref}$ by a sense amplifier 902 to determine a data state of the magnetic junction. The reference current $I_{ref}$ is chosen so the reference current $I_{ref}$ is between the read current $I_{read}$ at the two different states of a magnetic junction being read. Therefore, the magnetic junction is determined to be in a first data state if the read current $I_{read}$ is less than the reference current $I_{ref}$ and a second data state if the read current $I_{read}$ is greater than the reference current $I_{ref}$.

In some embodiments, the reference current $I_{ref}$ is the same between the MTP and OTP magnetic junctions 104a, 104b. For example, the reference current $I_{ref}$ may be the average of the current through the parallel reference magnetic junctions $MJ_{r,p}$ and the current through the anti-parallel reference magnetic junctions $MJ_{r,ap}$. Further, in some embodiments, the broken-down reference magnetic junction $MJ_{r,bd}$ is omitted and/or unused.

Use of the same reference current $I_{ref}$ between the OTP magnetic junctions 104b and the MTP magnetic junctions 104a is dependent upon the read window of the MTP magnetic junctions 104a overlapping with the read window of the OTP magnetic junctions 104b. A read window is the difference between read currents respectively at the two different states (e.g., parallel and anti-parallel states) of a magnetic junction 104. Without an overlap with the read widows, there would be no value for the reference current $I_{ref}$ that could be used to read both the MTP and OTP magnetic junctions 104a, 104b.

To ensure the read windows overlap, the OTP magnetic junctions 104b are restricted to the broken-down state and the anti-parallel state (an unbroken-down state). For example, during formation of the magnetic-junction array 102, some of the OTP magnetic junctions 104b may be set to the anti-parallel state and a remainder of the OTP magnetic junctions 104b may be broken down. As seen hereafter, the restriction is because read current in the broken-downs state is greater than read current in the parallel state, which is greater than read current in the anti-parallel state. However, the restriction is difficult to enforce.

As integrated chips continue to become smaller and smaller, the magnetic junctions 104 become smaller and smaller. However, small magnetic junctions are unable to retain stored data at high temperatures. The small magnetic junctions may, for example, be magnetic junctions with widths (e.g., the width W) less than or equal to about 75 nanometers, 70 nanometers, 60 nanometers, or some other suitable values. Hence, high temperatures could cause an initial state of an unbroken-down OTP magnetic junction to switch from anti-parallel to parallel, which would result in read failure of the unbroken-down OTP magnetic junction. The high temperatures may, for example, include temperatures greater than about 100 degrees Celsius and/or may, for example, arise during reflow (i.e., high temperature baking) used to bond the integrated chip to a PCB. Other temperatures are, however, amenable.

Additionally, the reference current $I_{ref}$ is generated from the parallel reference magnetic junctions $MJ_{r,p}$ and the anti-parallel reference magnetic junctions $MJ_{r,ap}$, such that the reference current $I_{ref}$ would be incorrect if the parallel and anti-parallel reference magnetic junctions $MJ_{r,p}$, $MJ_{r,ap}$ had the incorrect states. Further, the parallel and anti-parallel reference magnetic junctions $MJ_{r,p}$, $MJ_{r,ap}$ are subject to changes in states at high temperatures in the same manner as described above for the unbroken-down OTP magnetic junctions. Hence, high temperatures could change the reference current $I_{ref}$ and result in read failure.

In other embodiments, the reference current $I_{ref}$ is varied depending upon whether a magnetic junction being read is an OTP magnetic junction or an MTP magnetic junction. For example, the reference current $I_{ref}$ may be the average of the current through the parallel reference magnetic junctions $MJ_{r,p}$ and the current through the anti-parallel reference magnetic junctions $MJ_{r,ap}$ when reading an MTP magnetic junction. As another example, the reference current $I_{ref}$ may be the average of the current through the anti-parallel or parallel reference magnetic junction $MJ_{r,ap}$, $MJ_{r,p}$ and the current through the broken-down reference magnetic junctions $MJ_{r,bd}$ when reading an OTP magnetic junction.

By using an average of the current through the anti-parallel or parallel reference magnetic junction $MJ_{r,ap}$, $MJ_{r,p}$ and the current through the broken-down reference magnetic junctions $MJ_{r,bd}$ when reading an OTP magnetic junction, high-temperature read failure of the OTP magnetic junctions 104b may be avoided. The broken-down reference magnetic junction $MJ_{r,bd}$ is unaffected by high temperatures. Further, even if the state of the anti-parallel or parallel reference magnetic junction $MJ_{r,ap}$, $MJ_{r,p}$ changes at the high temperatures and/or an unbroken-down OTP magnetic junction changes between parallel and anti-parallel, the reference current $I_{ref}$ remains in the read window of the unbroken-down OTP magnetic junction and reads succeed.

Figure 9B:
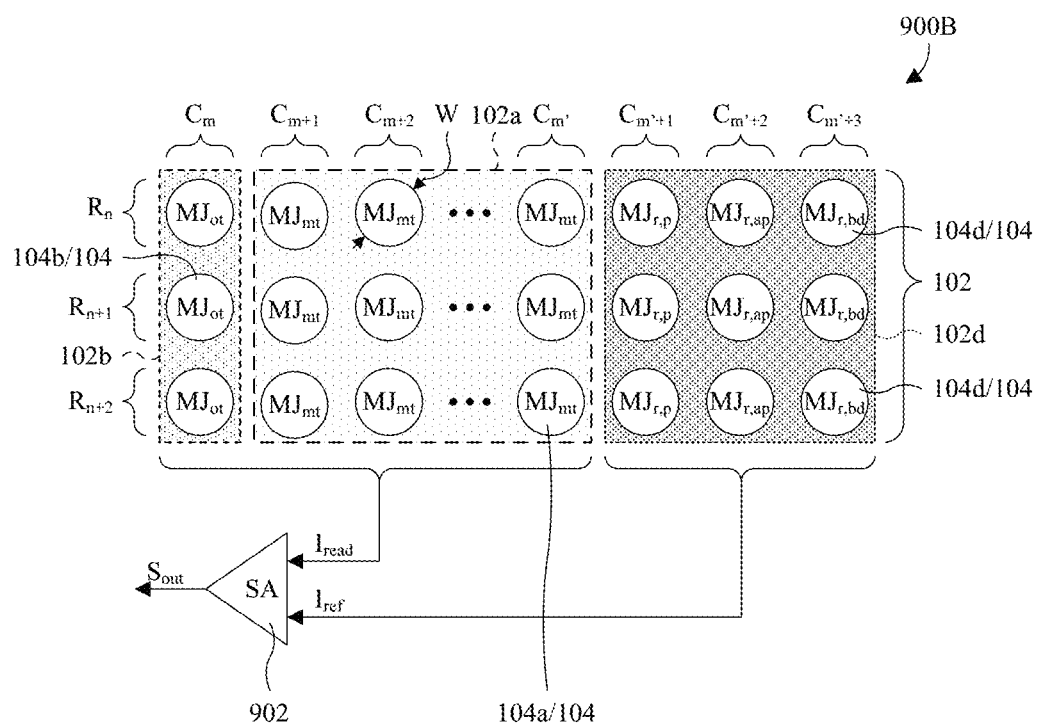

With reference to FIG. 9B, a top layout 900B of some alternative embodiments of the integrated chip of FIG. 9A is provided in which each row of the magnetic-junction array 102 comprises three individual reference magnetic junctions 104d: 1) a parallel reference magnetic junction $MJ_{r,p}$; 2) an anti-parallel reference magnetic junction $MJ_{r,ap}$; and 3) a breakdown reference magnetic junction $M_{Jr,bd}$. For ease of illustration, only some of the reference magnetic junctions 104d are labeled 104d. During readout of a magnetic junction in the MTP and OTP portions 102a, 102b, the individual reference magnetic junctions in a corresponding row of the magnetic junction are used to generate the reference current $I_{ref}$.

With FIGS. 9A and 9B expand upon embodiments of the magnetic-junction array 102 of FIG. 1, it is to be understood that FIGS. 9A and 9B may alternatively expand upon embodiments of the magnetic-junction array 102 of FIGS. 4A-4C. For example, the OTP portion 102b may be shifted to the right of the MTP portion 102a. As another example, the OTP portion 102b may be shifted above or below the MTP portion 102a.

Figure 10:
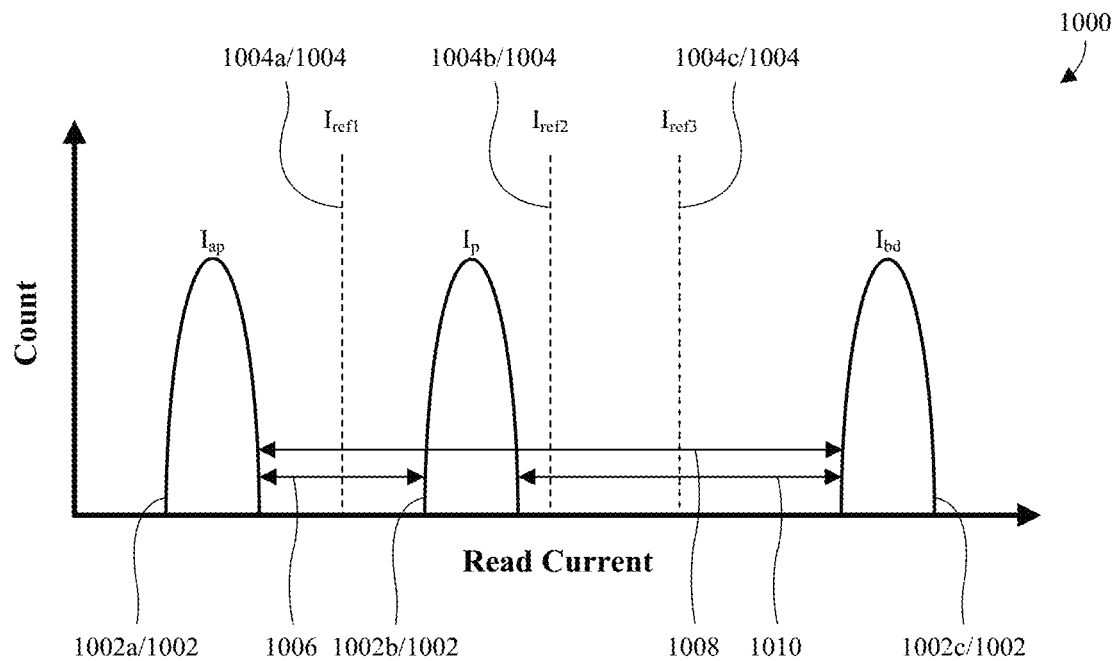
FIG. 10 illustrates a graph of some embodiments of read current distributions for the magnetic-junction array of FIGS. 9A and 9B and reference currents for use in FIGS. 9A and 9B.

With reference to FIG. 10, a graph 1000 of some embodiments of read current distributions 1002 for the magnetic-junction array 102 of FIGS. 9A and 9B and read currents 1004 for use in FIGS. 9A and 9B is provided. A horizontal axis of the graph 1000 corresponds to read current, and a vertical axis of the graph 1000 corresponds to the number of samples (i.e., different memory cells) having a given read current.

The read current distributions 1002 include an antiparallel read current distribution 1002a, a parallel read current distribution 1002b, and a broken-down read current distribution 1002c. The antiparallel read current distribution 1002a is representative of a read current for any one of the MTP magnetic junctions 104a in FIGS. 9A and 9B when in an antiparallel state (i.e., a high resistance state). The parallel read current distribution 1002b is representative of a read current for any one of the MTP magnetic junctions 104a in FIGS. 9A and 9B when in a parallel state (i.e., a low resistance state). When any one of the OTP magnetic junctions 104b in FIGS. 9A and 9B is unprogrammed, the OTP memory cell may be in an antiparallel or parallel state. Hence, the antiparallel or parallel read current distribution 1002a, 1002b may be representative of a read current for any one of the OTP magnetic junctions 104b in FIGS. 9A and 9B when in an unbroken-down state (i.e., a high resistance state). The broken-down read current distribution 1002c is representative of a read current for any one of the OTP magnetic junctions 104b in FIGS. 9A and 9B when in a broken-down state (i.e., a low resistance state).

A first reference current 1004a is at a center of an MTP read window 1006 for the MTP magnetic junctions 104a and is used by the sense amplifier 902 of FIGS. 9A and 9B to determine whether an MTP magnetic junction is in a parallel state or an anti-parallel state. The first reference current 1004a may, for example, correspond to an average of the current through an anti-parallel reference magnetic junction $MJ_{r,ap}$ of FIGS. 9A and 9B and the current through a parallel reference magnetic junction $MJ_{r,p}$ of FIGS. 9A and 9B.

In some embodiments, the first reference current 1004a is also used by the sense amplifier 902 of FIGS. 9A and 9B to determine whether an OTP magnetic junction is in a broken-down state or an unbroken-down state since it overlaps with a first OTP read window 1008 for the OTP magnetic junctions 104b so long as unprogrammed OTP magnetic junctions are restricted to the anti-parallel state. However, the first reference current 1004a is not equidistant from the antiparallel read current distribution 1002a and the broken-down read current distribution 1002c. Rather, the first reference current 1004a is much closer to the antiparallel read current distribution 1002a than the broken-down read current distribution 1002c, such that read failure is more likely when an OTP magnetic junctions 104b is in the unbroken-down state than when in the broken-down state. Further, if unprogrammed OTP magnetic junctions are not restricted to the anti-parallel state, the OTP magnetic junctions 104a shift to a second OTP read window 1010, which does not overlap with the first reference current 1004 and hence leads to read failure. As discussed above, the restriction is difficult to enforce at high temperatures.

In other embodiments, a second reference current 1004b or a third reference current 1004c are used by the sense amplifier 902 of FIGS. 9A and 9B to determine whether an OTP magnetic junction is in a broken-down state or an unbroken-down state. The second reference current 1004b is at a center of the first OTP read window 1008 and may, for example, correspond to an average of the current through an anti-parallel reference magnetic junction $MJ_{r,ap}$ of FIGS. 9A and 9B and the current through a broken-down reference magnetic junction $MJ_{r,bd}$ of FIGS. 9A and 9B. The third reference current 1004c is at a center of the second OTP read window 1010 and may, for example, correspond to an average of the current through a parallel reference magnetic junction $MJ_{r,p}$ of FIGS. 9A and 9B and the current through a broken-down reference magnetic junction $MJ_{r,bd}$ of FIGS. 9A and 9B. The second reference current 1004b and the third reference current 1004c both overlap with the first and second OTP read windows 1008, 1010, such that readout of the OTP magnetic junctions 104b of FIGS. 9A and 9B succeeds even at high temperatures (e.g., from reflow).

The states of broken-down magnetic junctions are unaffected by high temperatures, whereby upper bounds of the first and second OTP read windows 1008, 1010 can be assumed to be fixed. Further, the states of unbroken-down magnetic junctions may be affected by high temperatures and may hence vary between an anti-parallel state and a parallel state. Therefore, lower bounds of the first and second OTP read windows 1008, 1010 may vary between the antiparallel read current distribution 1002a and the parallel read current distribution 1002b. However, even with this variation, the second and third reference currents 1004b, 1004c still overlap with the first and second OTP read windows 1008, 1010, whereby readout may still succeed at high temperatures. Further yet, while high temperatures may vary the locations of the second and third reference currents 1004b, 1004c, the second and third reference currents 1004b, 1004c continue to overlap with the first and second OTP read windows 1008, 1010, whereby readout may still succeed at high temperatures.

The locations of the second and third reference currents 1004b, 1004c are the average of the current through a broken-down reference magnetic junction $MJ_{r,bd}$ of FIGS. 9A and 9B and the current through an anti-parallel or parallel reference magnetic junctions $MJ_{r,ap}$, $MJ_{r,p}$ of FIGS. 9A and 9B. As noted above, the state of a broken-down reference magnetic junction $MJ_{r,bd}$ can be assumed to be fixed, whereby the current through the broken-down reference magnetic junction $MJ_{r,bd}$ can assumed to be fixed. Therefore, it's the current through the anti-parallel or parallel reference magnetic junctions $MJ_{r,ap}$, $MJ_{r,p}$ that may vary with high temperatures. However, the current varies between the antiparallel read current distribution 1002a and the parallel read current distribution 1002b, and both current at the antiparallel read current distribution 1002a and current at the parallel read current distribution 1002b lead to a reference current overlapping with the first and second OTP read windows 1008, 1010.

Figure 11:
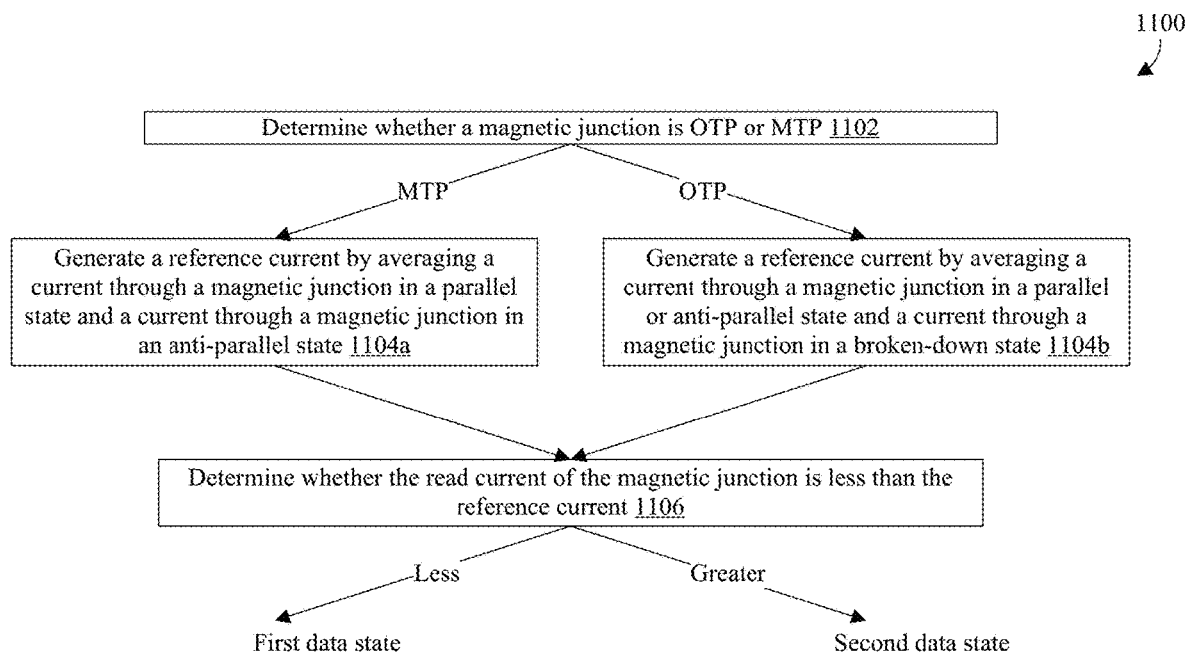
FIG. 11 illustrates a block diagram of some embodiments of a process performed by the integrated chip of FIGS. 9A and 9B to read a state of a magnetic junction.

With reference to FIG. 11, a block diagram 1100 of some embodiments of a process performed by the integrated chip of FIGS. 9A and 9B to read a state of a magnetic junction is provided. The process may, for example, be performed regardless of the whether the magnetic junction is an OTP magnetic junction or an MTP magnetic junction.

At 1102, a determination is made as to whether the magnetic junction is OTP or MTP. The determination may, for example, be made based on a provided memory address of the magnetic junction and/or the known locations of an OTP and MTP memory cells.

At 1104a, in response to determine the magnetic junction is MTP, a reference current is generated by averaging a current through a reference magnetic junction in a parallel state and a current through a reference magnetic junction in an anti-parallel state. The current through the reference magnetic junction in the parallel state may, for example, be generated by applying a read voltage across the reference magnetic junction. Similarly, the current through the reference magnetic junction in the anti-parallel state may, for example, be generated by applying a read voltage across the reference magnetic junction.

At 1104b, in response to determine the magnetic junction is MTP, a reference current is generated by averaging a current through a reference magnetic junction in a parallel or anti-parallel state and a current through a reference magnetic junction in a broken-down state. The current through the reference magnetic junction in the parallel or anti-parallel state may, for example, be generated by applying a read voltage across the reference magnetic junction. Similarly, the current through the reference magnetic junction in the broken-down state may, for example, be generated by applying a read voltage across the reference magnetic junction.

At 1106, a determination is made as to whether a read current through the magnetic junction is less than the reference current, regardless of whether the reference current is generated at 1104a or 1104b. The read current may, for example, be generated by applying a read voltage across the magnetic junction. In response to determining the read current is less than the reference current, the magnetic junction has a first data state (e.g., a logic "0"). In response to determining the read current is greater than the reference current, the magnetic junction has a second data state (e.g., a logic "1").

While the block diagram 1100 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 12A:
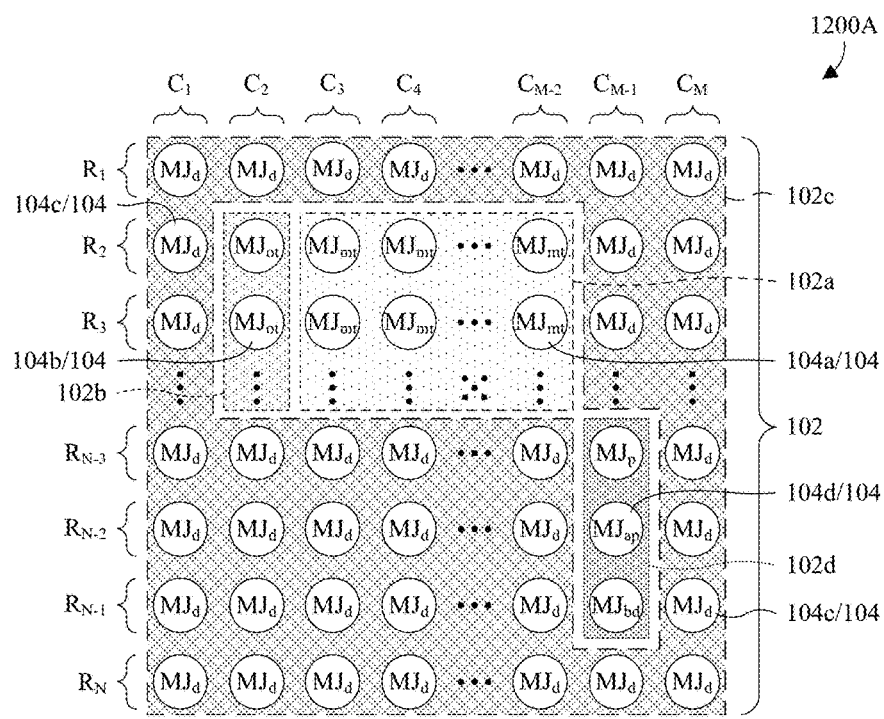
FIGS. 12A-12D illustrate expanded top layouts of various alternative embodiments of the integrated chip of FIG. 9A.

With reference to FIG. 12A, an expanded top layout 1200A of some embodiments of the integrated chip of FIG. 9A is provided. The expanded top layout 1200A is expanded in that it illustrates additional rows and columns. For example, the top layout 1200 illustrates columns 1 to M and rows 1 to N, where M and N are integers respectively representing a total number of columns and a total number of rows in the magnetic-junction array 102.

The dummy portion 102c is at an edge of the magnetic-junction array 102 and extends in a closed path to surround the MTP portion 102a of the magnetic-junction array 102, the OTP portion 102b of the magnetic-junction array 102, and the reference portion 102d of the magnetic-junction array 102. Further, in some embodiments, the dummy portion 102c is in the same column (e.g., column $C_{M-1}$) and the same rows (e.g., rows $R_{N-3}$ to row $R_{N-1}$) as the reference portion 102d. Magnetic junctions at the edge of the magnetic-junction array 102 suffer from non-uniformity due to a large change in feature density at the edge of the magnetic-junction array 102. The large change causes non-uniformity in processes used to form the magnetic junctions at the edge of the magnetic-junction array 102, which causes the non-uniformity. Hence, the dummy portion 102c serves as a buffer to prevent non-uniformity with magnetic junctions 104 offset from the edge of the magnetic-junction array 102.

Figure 12B:
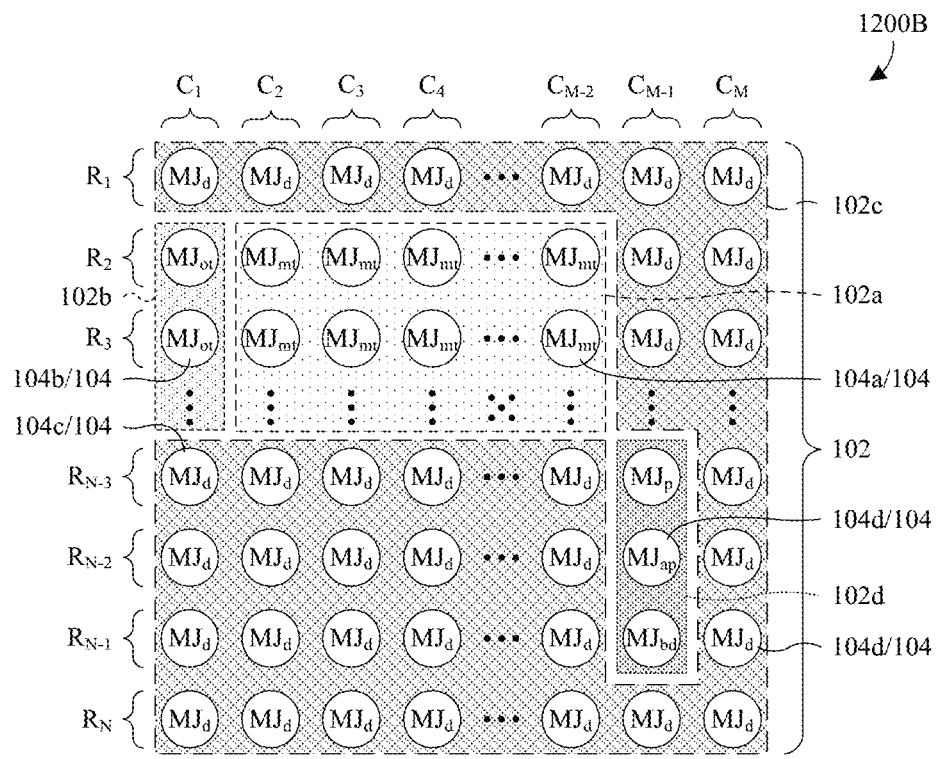

With reference to FIG. 12B, a top layout 1200B of some alternative embodiments of the integrated chip of FIG. 12A is provided in which the OTP portion 102b is at an edge of the magnetic-junction array 102. The read and write windows for the OTP magnetic junctions 104b are relatively large compared to the read and write windows for the MTP magnetic junctions 104a. Hence, read and write operations with the OTP magnetic junctions 104b can tolerate non-uniformity at the edge of the magnetic-junction array 102, thereby allowing previously unused magnetic junctions to be used. This, in turn, may increase the functional density of the integrated chip and may reduce manufacturing costs.

Figure 12C:
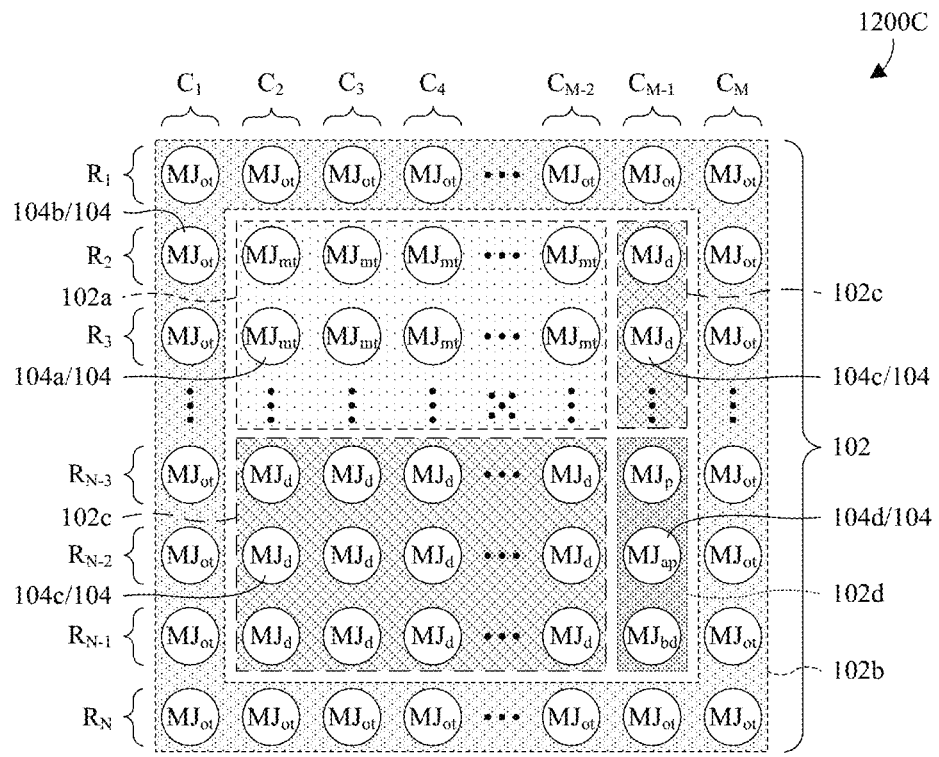

With reference to FIG. 12C, a top layout 1200C of some alternative embodiments of the integrated chip of FIG. 12A is provided in which the OTP portion 102b is at an edge of the magnetic-junction array 102 and extends in a closed path to enclose the MTP portion 102a, the reference portion 102d, and the dummy portion 102c. For example, the OTP portion 102b may be square-ring shaped or some other suitable shape.

Figure 12D:
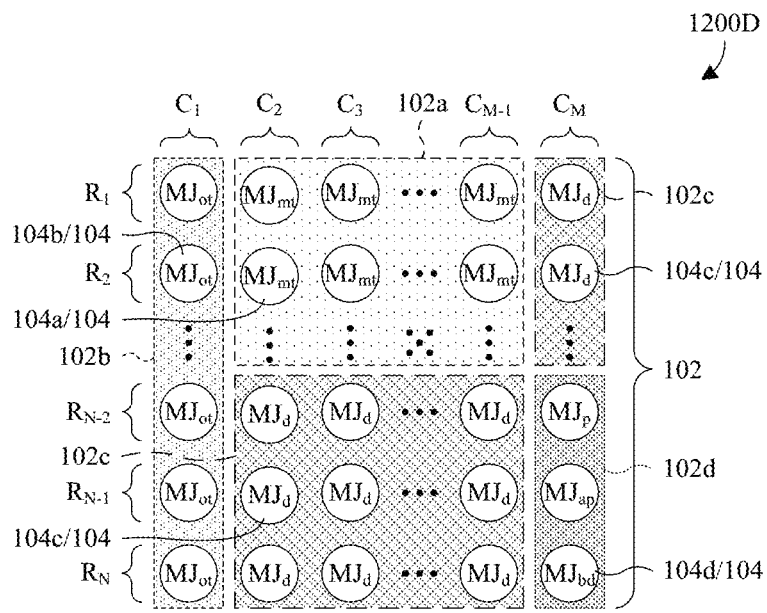

With reference to FIG. 12D, a top layout 1200D of some alternative embodiments of the integrated chip of FIG. 12A is provided in which the MTP portion 102a, the OTP portion 102b, and the reference portion 102d adjoin the edge of the magnetic-junction array 102. As such, there are no dummy magnetic junctions within view and out of view at the edge of the magnetic-junction array 102, except for at the dummy portion 102c.

Figure 13A:
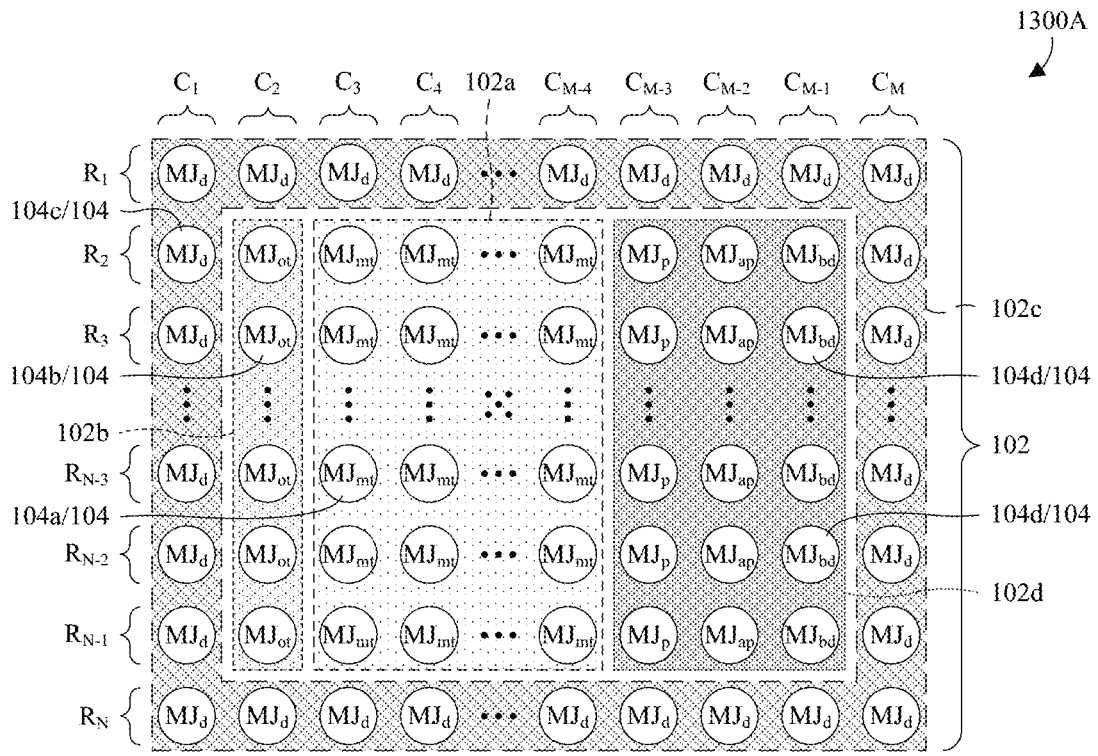
FIGS. 13A-13D illustrate expanded top layouts of various alternative embodiments of the integrated chip of FIG. 9B.
Figure 13B:
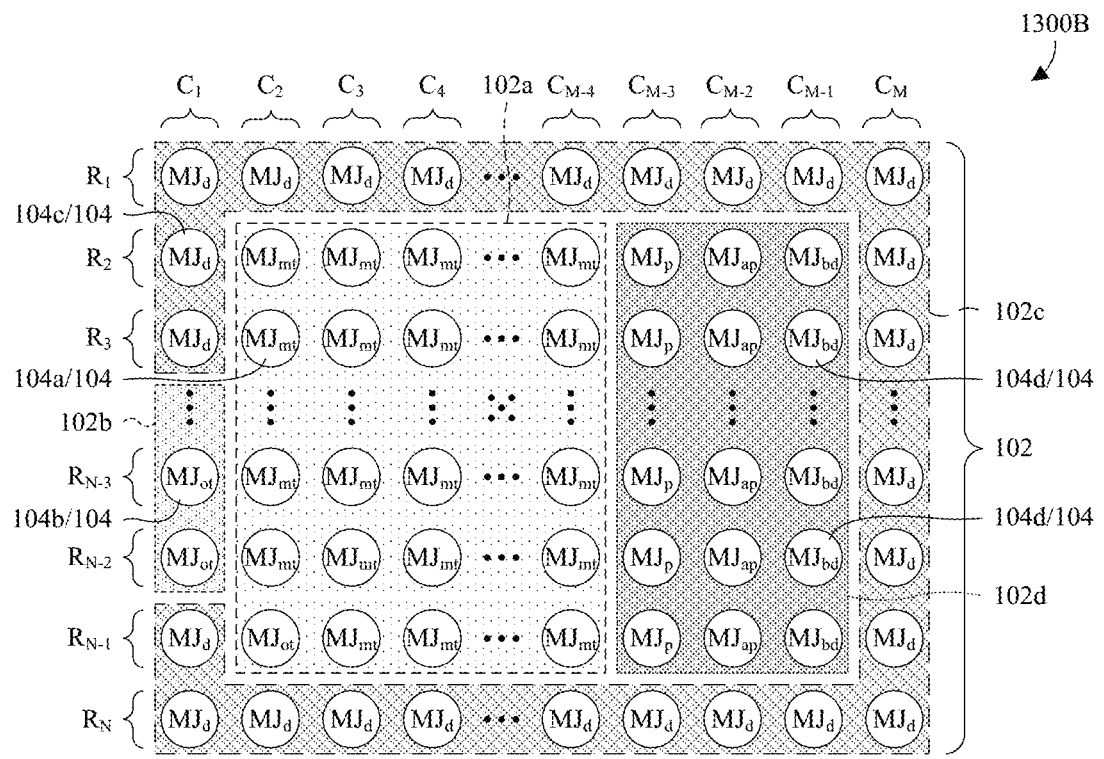
Figure 13C:
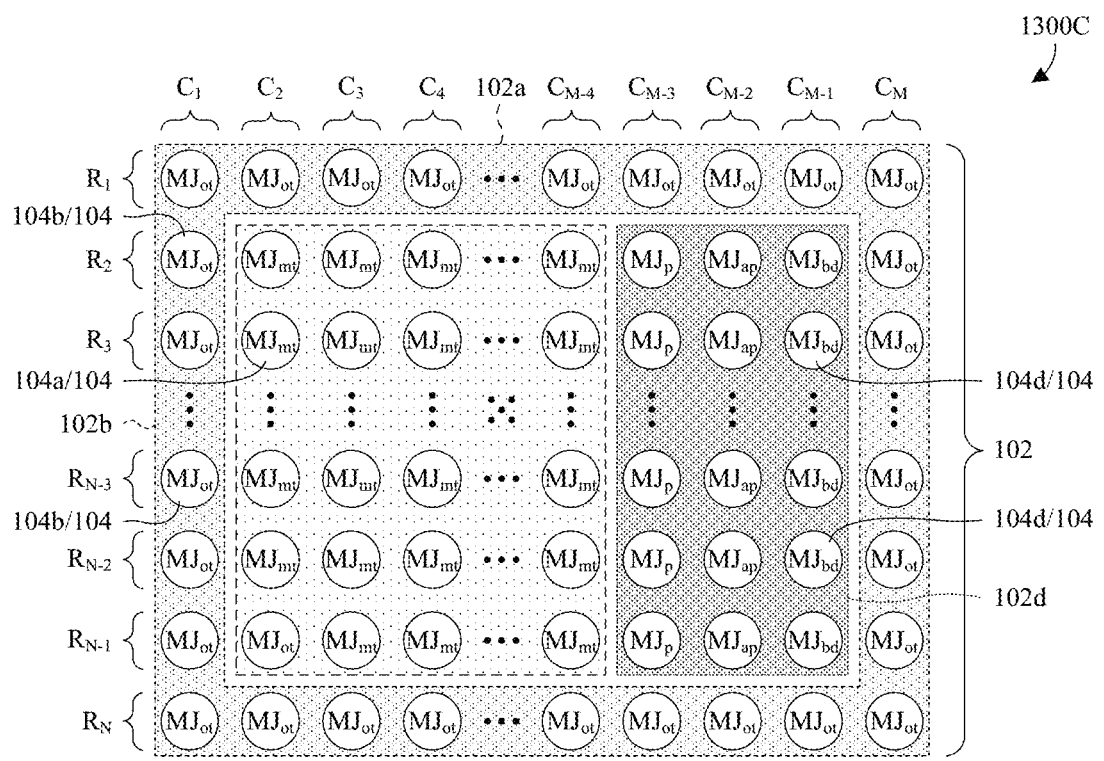
Figure 13D:
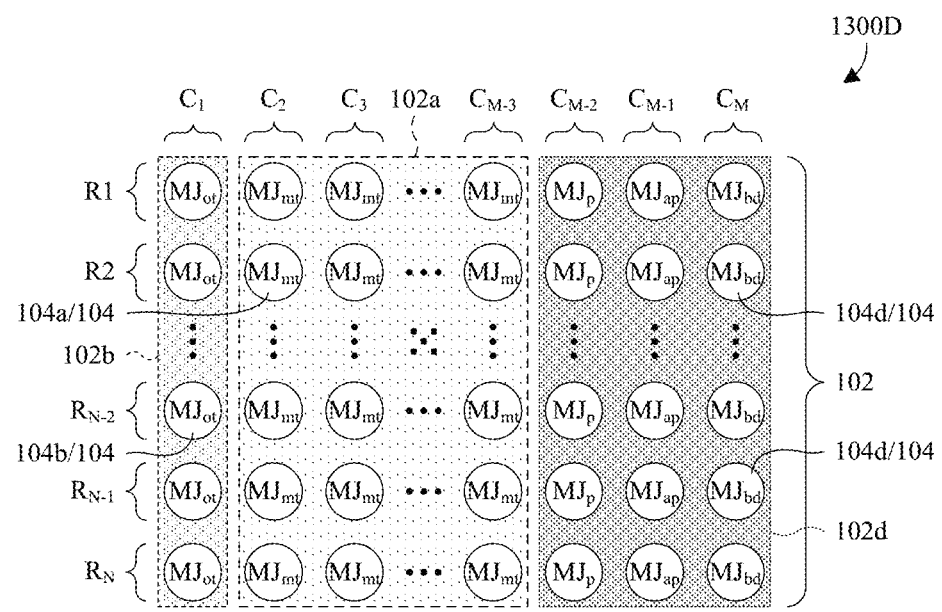

With reference to FIGS. 13A-13D, top layouts 1300A-1300D of some alternative embodiments of the integrated chip of FIG. 9B is provided. FIGS. 13A-13D are respectively variants of FIGS. 12A-12D in which the layout of FIG. 9A is used in place of the layout of FIG. 9B. For example, FIG. 13A is a variant of FIG. 12A in which the layout of FIG. 9A has been replaced by the layout of FIG. 9B.

Figure 14A:
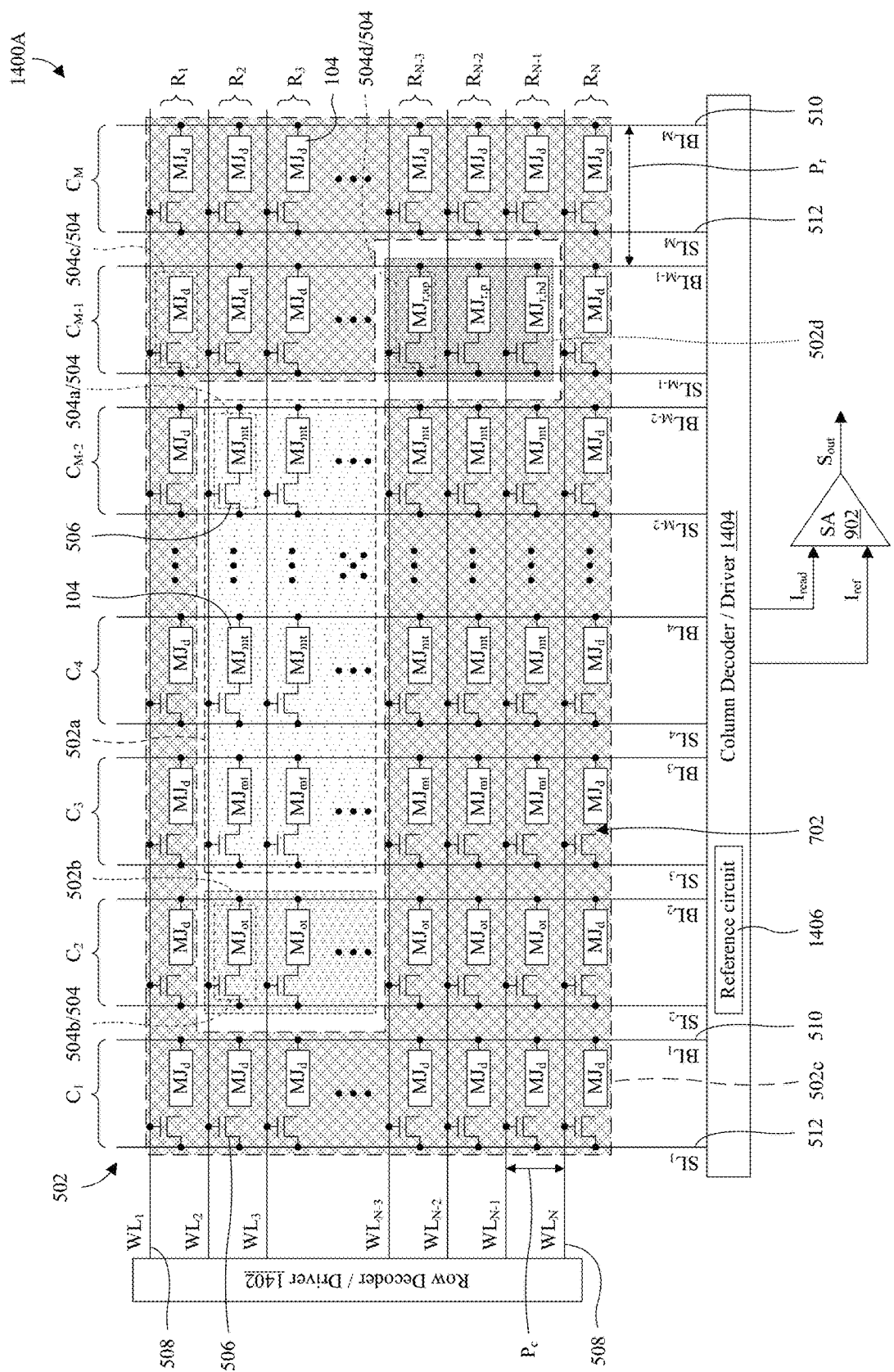
FIGS. 14A and 14B illustrate schematic diagrams of various embodiments of an integrated chip comprising a memory array respectively with the magnetic-junction arrays of FIGS. 12A and 13A.

With reference to FIG. 14A, a schematic diagram 1400A of some embodiments an integrated chip comprising a memory array 502 with the magnetic-junction array 102 of FIG. 12A is provided. The memory array 502 comprises multiple memory cells 504 distributed amongst an MTP portion 502a, an OTP portion 502b, a dummy portion 502c, and a reference portion 502d. For ease of illustration, only some of the memory cells 504 are labeled 504. The memory cells 504 are in M columns and N rows, where M and N are integers respectively represent a total number of columns and a total number of rows. The memory cells 504 comprise individual access transistors 506 and individual magnetic junctions 104. For ease of illustration, only some of the access transistors 506 are labeled 506 and only some of the magnetic junctions 104 are labeled 104.

Memory cells 504a in the MTP portion 502a (i.e., MTP memory cells 504a) each store a bit of data, the state of which varies depending upon magnetizations of an individual magnetic junction $MJ_{mt}$. For ease of illustration, only one of the MTP memory cells 504a is individually labeled 504a. Memory cells 504b in the OTP portion 502b (i.e., OTP memory cells 504b) each store a bit of data, the state of which varies depending upon whether an individual magnetic junction $MJ_{ot}$ has undergone breakdown. For ease of illustration, only one of the OTP memory cells 504b is individually labeled 504b. Memory cells 504c in the dummy portion 502c (i.e., dummy memory cells 504c) are unused and typically have poor uniformity compared to the MTP and OTP memory cells 504a, 504b. In some embodiments, the dummy memory cells 504c have magnetic junctions and access transistors that are electrically separated, as denoted by gaps 702. For ease of illustration, only one of the dummy memory cells 504c is labeled 504c and only one of the gaps 702 is labeled 702. Memory cells 504d in the reference portion 502d (i.e., reference memory cells 504d) correspond to the different states of the MTP and OTP memory cells 504a, 504b and are used to generate a reference current $I_{ref}$ during readout (discussed hereafter) of one of the MTP and OTP memory cells 504a, 504b. For ease of illustration, only one of the reference memory cells 504d is labeled 504d.

In some embodiments, the memory cells 504 share a common size, regardless of whether in the MTP portion 502a, the OTP portion 502b, the dummy portion 502c, or the reference portion 502d. In some embodiments, a row-wise pitch $P_r$ of the memory array 502 is uniform throughout the memory array 502, regardless of whether at and/or between the MTP portion 502a, the OTP portion 502b, the dummy portion 502c, and the reference portion 502d. Similarly, in some embodiments, a column-wise pitch $P_c$ of the memory array 502 is uniform throughout the memory array 502, regardless of whether at and/or between the MTP portion 502a, the OTP portion 502b, the dummy portion 502c, or the reference portion 502d. The row-wise pitch $P_r$ may, for example, be 260 nanometers or less, and/or the column-wise pitch $P_c$ may, for example, be 220 nanometers or less, or vice versa. Other values for the row-wise pitch $P_r$ and/or the column-wise pitch $P_c$ are, however, amenable.

A set of word lines 508 and a row decoder/driver 1402 facilitate selection of the memory cells 504 on a row-by-row basis. For ease of illustration, only some of the word lines 508 are labeled 508. The word lines 508 extend laterally along corresponding rows of the memory array 502 and electrically couple with gates of access transistors in the corresponding rows. The row decoder/driver 1402 selects a row via the word lines 508 depending upon a memory address (not shown). For example, the row decoder/driver 1402 may select a row of the memory address by biasing a word line at the row with a voltage in excess of a threshold voltage of the access transistors 506. Further, in some embodiments, the row decoder/driver 1402 selects rows of the reference portion 502d during read operations. For example, the row decoder/driver 1402 may select row $R_{N-3}$ and row $R_{N-2}$, but not row $R_{N-1}$, during a read operation for an MTP memory cell. As another example, the row decoder/driver 1402 may select row $R_{N-1}$ and row $R_{N-3}$, but not row $R_{N-2}$, during a read operation for an OTP memory cell. As yet another example, the row decoder/driver 1402 may select row $R_{N-1}$ and row $R_{N-2}$, but not row $R_{N-3}$, during a read operation for an OTP memory cell.

A set of bit lines 510, a set of source lines 512, and a column decoder/driver 1404 facilitate reading from and/or writing to selected memory cells on a column-by-column basis. The bit lines 510 extend laterally along corresponding columns of the memory array 502 and electrically couple with magnetic junctions in the corresponding columns. The source lines 512 extend laterally along corresponding columns of the memory array 502 and electrically couple with sources of access transistors in the corresponding columns.

To write to a selected memory cell, the column decoder/driver 1404 applies a write voltage across the selected memory cell with a bit line in a column of the selected memory cell and a source line in the column. To read from a selected memory cell, the column decoder/driver 1404 applies a read voltage to a terminal of the selected memory cell with one of the bit and source lines in a column of the selected memory cell. A read current $I_{read}$ at the other one of the bit and source lines in the column is then fed to a sense amplifier 902, where it is compared to a reference current $I_{ref}$ to determine a data state of the selected memory cell.

A reference circuit 1406 generates the reference current $I_{ref}$ from the reference memory cells 504$d$. For example, assuming the row decoder/driver 1402 appropriately selects two rows of the reference portion 502$d$, as described above, applying a read voltage to one of the bit and source lines in column $C_{M-1}$ results in a composite current at the other one of the bit and source lines in column $C_{M-1}$. The composite current is the sum of the currents flowing through the selected reference memory cells, whereby the reference current $I_{ref}$ may be generated by the reference circuit 1406 halving the composite current. In some embodiments, the reference circuit 1406 is part of the column decoder/driver 1404. In other embodiments, the reference circuit 1406 is independent of the column decoder/driver 1404.

Figure 14B:
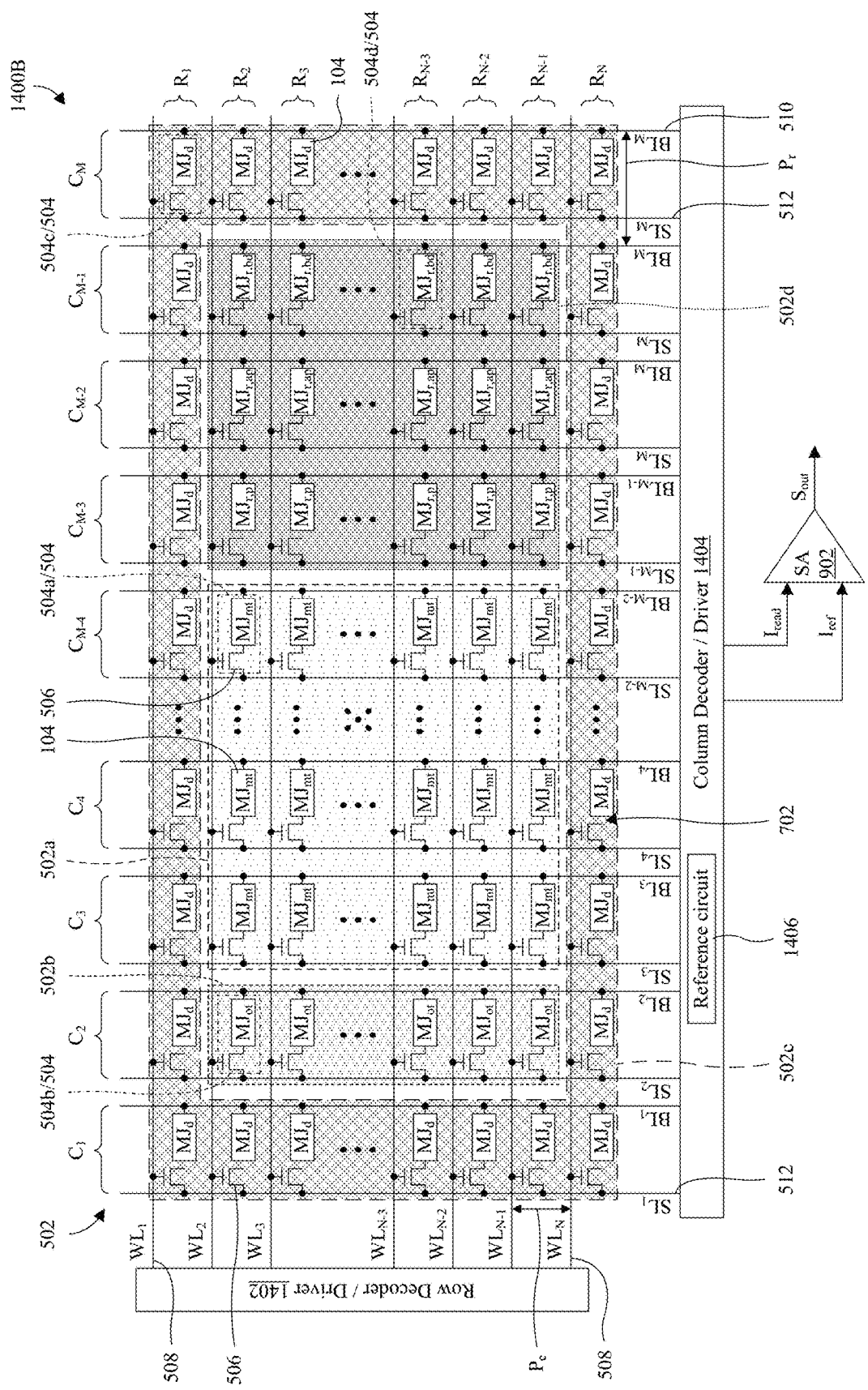

With reference to FIG. 14B, a schematic diagram 1400B of some embodiments an integrated chip comprising a memory array 502 with the magnetic-junction array 102 of FIG. 13A is provided. FIG. 14B may, for example, be regarded as a variant of FIG. 14A in which the magnetic-junction array 102 of FIG. 13A is used in placed of the magnetic-junction array 102 of FIG. 12A, whereby FIG. 14B may, for example, be as FIG. 14A is described except as it pertains to generation of the reference current $I_{ref}$.

Since each of the rows has a complete set of reference cells (i.e., one reference cell for each state of the MTP and OTP memory cells 504$a$, 504$b$), the row decoder 1402 selects a complete set of reference cells when it selects a row of memory cells for readout. Further, during readout, the column decoder/driver 1404 biases bit lines for two of the selected reference cells depending upon a type of memory cell being read. For example, the column decoder/driver 1404 may select column $C_{M-3}$ and column $C_{M-2}$, but not column $C_{M-1}$, during readout of an MTP memory cell. As another example, the column decoder/driver 1404 may select column $C_{M-1}$ and column $C_{M-3}$, but not column $C_{M-2}$, during readout of an OTP memory cell. As yet another example, the column decoder/driver 1404 may select column $C_{M-1}$ and column $C_{N-2}$, but not column $C_{M-3}$, during readout of an OTP memory cell. Biasing the bit lines for the two selected reference cells results in read currents at corresponding source lines. The reference circuit 1406 then averages the read currents to generate the reference current $I_{ref}$.

While FIG. 14A is illustrated with embodiments of the magnetic-junction array 102 in FIG. 12A, embodiments of the magnetic-junction array 102 in any one of FIGS. 12B-12D may be alternatively used. While FIG. 14B is illustrated with embodiments of the magnetic-junction array 102 in FIG. 13A, embodiments of the magnetic-junction array 102 in any one of FIGS. 13B-13D may be alternatively used.

With reference to FIGS. 15-19, a series of cross-sectional views 1500-1900 of some embodiments of a method for forming an integrated chip comprising a memory array 502 with an MTP portion 502$a$, an OTP portion 502$b$, a dummy portion 502$c$, and a reference portion 502$d$ is provided. For ease of illustration, only one memory cell is illustrated in each of the portions. In practice, however, there will be multiple memory cells in each of the portions. Further, it should be appreciated that the relative positioning of the portions is for illustrative purposes and should not be construed as limiting. Multiple examples of the relative positioning of the portions are described above. See, for example, FIGS. 12A-12D and FIGS. 13A-13D.

As illustrated by the cross-sectional view 1500 of FIG. 15, access transistors 506 are formed on a substrate 802, respectively at the MTP portion 502$a$, the OTP portion 502$b$, the dummy portion 502$c$, and the reference portion 502$d$. For ease of illustration, only some of the illustrated segments of the substrate 802 are labeled 802. Although not visible within the cross-sectional view 1500 of FIG. 15, the access transistors 506 may, for example, be formed in a plurality of rows and a plurality of columns when viewed top down so as to define an access-transistor array. The access transistors 506 may, for example, have a uniform size throughout the access-transistor array and/or the access-transistor array may, for example, have a uniform row-wise pitch and/or a uniform column-wise pitch throughout the access-transistor array.

The access transistors 506 comprise individual pairs of source/drain regions 804, individual gate dielectric layers 806, and individual gate electrodes 808. For ease of illustration, only some of the source/drain regions 804 are labeled 804, only some of the gate dielectric layers 806 are labeled 806, and only some of the gate electrodes 808 are labeled 808. The source/drain regions 804 are in the substrate 802 and have an opposite doping type as adjoining portions of the substrate 802. The gate dielectric layers 806 overlie the substrate 802 and are each sandwiched between two of the source/drain regions 804. The gate electrodes 808 respectively overlie the gate dielectric layers 806. The access transistors 506 may, for example, be MOSFETs, IGFETs, or some other suitable transistors.

In some embodiments, a process for forming the access transistors 506 comprises: 1) depositing a dielectric layer on the substrate 802; 2) depositing a conductive layer on the dielectric layer; 3) patterning the dielectric layer and the conductive layer respectively into the gate dielectric layers 806 and the gate electrodes 808; and 4) implanting dopants into the substrate 802 to form the source/drain regions 804. Other processes for forming the access transistors 506 are, however, amenable. The depositing of the dielectric layer may, for example, be performed by chemical vapor deposition (CVD), physical vapor deposition (PVD), thermal oxidation, some other suitable deposition process(es), or any combination of the foregoing. The depositing of the conductive layer may, for example, be performed by CVD, PVD, electroless plating, electroplating, some other suitable deposition process(es), or any combination of the foregoing. The patterning may, for example, be performed by a photolithography/etching process and/or some other suitable patterning process(es). The implanting may, for example, be performed by ion implantation and/or some other suitable implantation process(es).

As illustrated by the cross-sectional view 1600 of FIG. 16, an interconnect structure 1602 is partially formed over the substrate 802 and the access transistors 506. The interconnect structure 1602 comprises a lower interconnect dielectric layer 1604, multiple wires 810, and multiple vias 812. For ease of illustration, only some of the wires 810 are labeled 810 and only some of the vias 812 are labeled 812. Further, only some of the illustrated segments of the lower interconnect dielectric layer 1604 are labeled 1604.

The lower interconnect dielectric layer 1604 accommodates the wires 810 and the vias 812 and may, for example, be or comprise silicon oxide, a low κ dielectric, some other suitable dielectric(s), or any combination of the foregoing.

As used herein, a low κ dielectric may be, for example, a dielectric with a dielectric constant κ less than about 3.9, 3, 2, or 1. The wires 810 and the vias 812 are alternatingly stacked in the lower interconnect dielectric layer 1604 to define conductive paths leading from the access transistors 506. Further, the wires 810 and the vias 812 have the same layout at the MTP portion 502a, the OTP portion 502b, the dummy portion 502c, and the reference portion 502d, except that, in some (not all) embodiments, a via is missing at the dummy portion 502c (denoted by a dashed oval 1606). As seen hereafter, the missing via renders the memory cell at the dummy portion 502c non-functional.

The wires 810 and the vias 812 define first conductive paths from first source/drain regions to individual source lines 512, and further define second conductive paths from the gate electrodes 808 to individual word lines 508. For ease of illustration, only some of the word lines 508 are labeled 508 and only some of the source lines 512 are labeled 512. Further, the wires 810 and the vias 812 define third conductive paths from second source/drain regions to a top of the lower interconnect dielectric layer 1604. In some embodiments, a third conductive path at the dummy portion 502c is discontinuous due to a missing via (denoted by the dashed oval 1606). In other embodiments, the third conductive path at the dummy portion 502c is continuous.

In some embodiments, a process for partially forming the interconnect structure 1602 comprises: 1) forming a bottommost layer of the vias 812 by a single damascene process; 2) forming a bottommost layer of the wires 810 by the single damascene process; 3) forming wires and vias over the bottommost layer of the wires 810 by repeatedly performing a dual damascene process; and 4) forming bottom electrode vias (BEVAs) of the vias 812 by a single damascene process. Other processes for partially forming the interconnect structure 1602 are, however, amenable. In some embodiments, the single damascene process comprises: 1) depositing a dielectric layer; 2) patterning the dielectric layer with openings for a single layer of conductive features (e.g., a layer of vias or a layer of wires); 3) and filling the openings with conductive material to form the single layer of conductive features. In some embodiments, the dual damascene process comprises: 1) depositing a dielectric layer; 2) patterning the dielectric layer with openings for two layers of conductive features (e.g., a layer of vias and a layer of wires); 3) and filling the openings with conductive material to form the two layers of conductive features. In both the single and dual damascene processes, the dielectric layer is a portion of the lower interconnect dielectric layer 1604.

Figure 17:
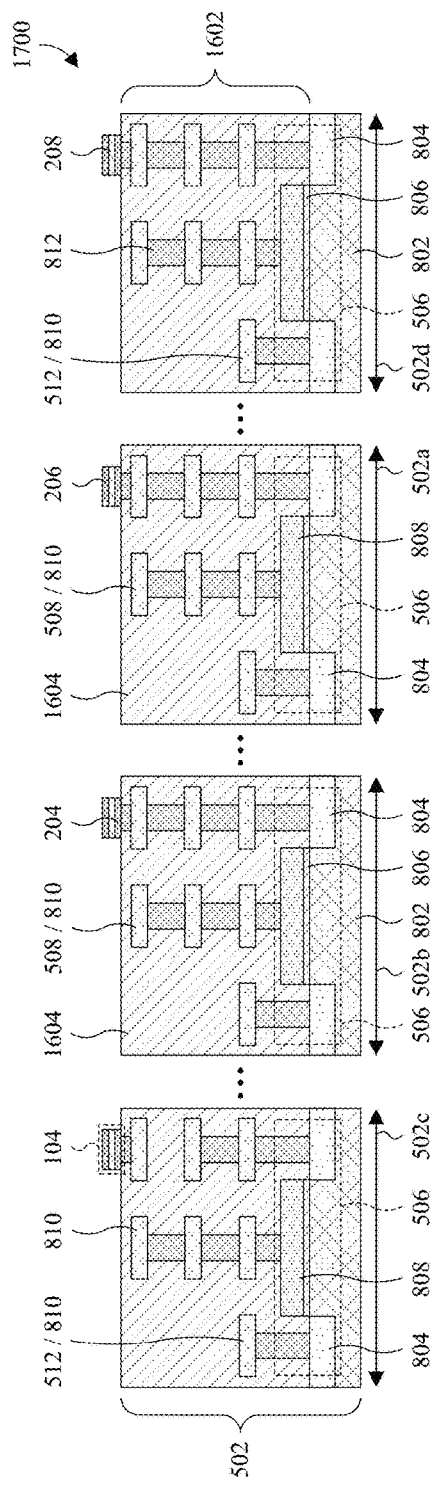

As illustrated by the cross-sectional view 1700 of FIG. 17, magnetic junctions 104 are formed on the interconnect structure 1602, respectively at the MTP portion 502a, the OTP portion 502b, the dummy portion 502c, and the reference portion 502d. Further, the magnetic junctions 104 are formed respectively on topmost vias. Although not visible within the cross-sectional view 1700 of FIG. 17, the magnetic junctions 104 may, for example, be formed in a plurality of rows and a plurality of columns when viewed top down so as to define a magnetic-junction array. The magnetic junctions 104 may, for example, have a uniform size throughout the magnetic-junction array and/or the magnetic-junction array may, for example, have a uniform row-wise pitch and/or a uniform column-wise pitch throughout the access-transistor array. Examples of the magnetic-junction array are in FIGS. 1, 4A-4C, 9A, 9B, 12A-12D and 13A-13D. The magnetic junctions 104 comprise individual reference elements 204, individual barrier elements 208, and individual free elements 206. In some embodiments, the barrier elements 208 respectively overlie the reference elements 204, and the free elements 206 respectively overlie the barrier elements 208. In other embodiments, the barrier elements 208 respectively overlie the free elements 206, and the reference elements 204 respectively overlie the barrier elements 208. The magnetic junctions 104 may, for example, be MTJs, spin valves, or some other suitable magnetic junctions. Further, the magnetic junctions 104 may, for example, each be as the unbroken-down magnetic junction 302 of FIG. 3 is described.

In some embodiments, a process for forming the magnetic junctions 104 comprises: 1) depositing a reference layer on the interconnect structure 1602; 2) depositing a barrier layer on the reference layer; 3) depositing a free layer on the barrier layer; and 4) patterning the reference, barrier, and free layers into the magnetic junctions 104. Other processes are, however, amenable. For example, the free layer may be deposited at 1) and the reference layer may be deposited at 3). The depositing may, for example, be performed by CVD, PVD, electroless plating, electroplating, some other suitable deposition process(es), or any combination of the foregoing. The patterning may, for example, be performed by a photolithography/etching process and/or some other suitable patterning process(es).

Figure 18:
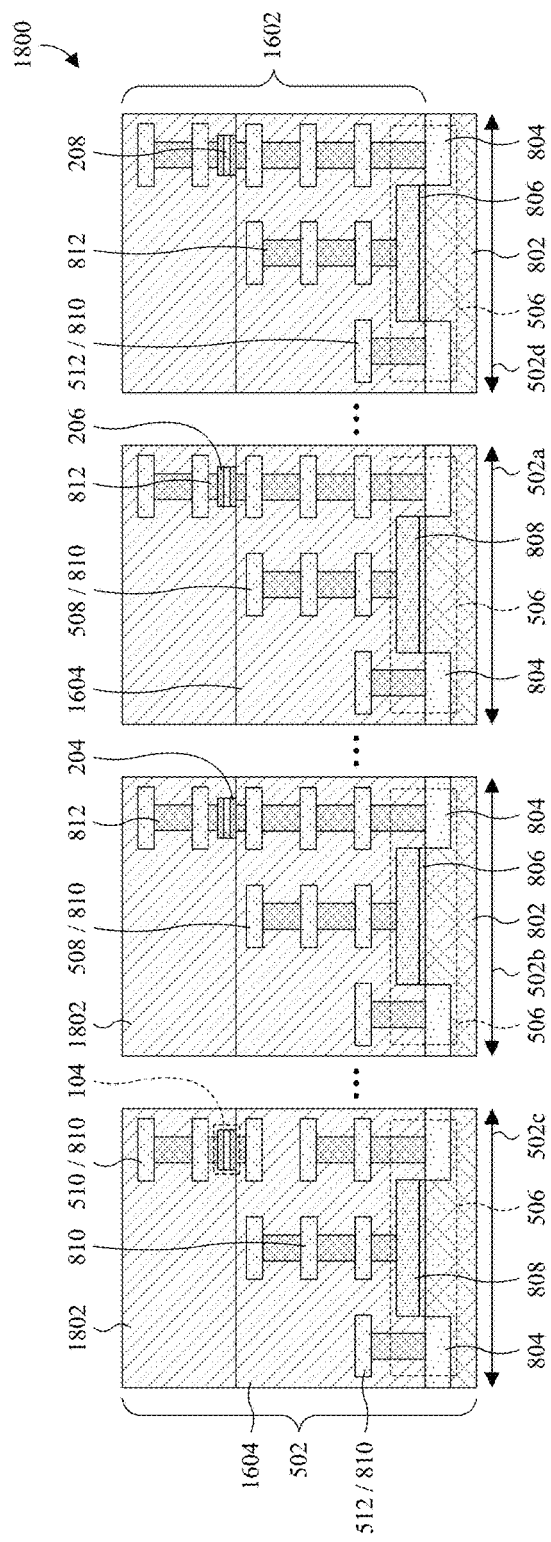

As illustrated by the cross-sectional view 1800 of FIG. 18, the interconnect structure 1602 is completed around the magnetic junctions 104, whereby an upper interconnect dielectric layer 1802 is formed over the magnetic junctions 104. Further, additional wires 810 and additional vias 812 are formed in the upper interconnect dielectric layer 1802. For ease of illustration, only some of the additional wires 810 are labeled 810 and only some of the additional vias 812 are labeled 812. Further, only some of the illustrated segments of the upper interconnect dielectric layer 1802 are labeled 1802.

The upper interconnect dielectric layer 1802 accommodates the additional wires 810 and the additional vias 812 and may, for example, be or comprise silicon oxide, a low κ dielectric, some other suitable dielectric(s), or any combination of the foregoing. The additional wires 810 and the additional vias 812 are alternatingly stacked in the upper interconnect dielectric layer 1802 to define conductive paths leading from the magnetic junctions 104 to bit lines 510. For ease of illustration, only one of the bit lines 510 is labeled 510. Further, the additional wires 810 and the additional vias 812 have the same layout at the MTP portion 502a, the OTP portion 502b, the dummy portion 502c, and the reference portion 502d.

In some embodiments, a process for completing the interconnect structure 1602 comprises: 1) forming top electrode vias (TEVAs) of the additional vias 812 by a single damascene process; 2) forming additional wires and additional vias over the TEVAs by repeatedly performing a dual damascene process; and 3) depositing a passivation layer over the additional wires and the additional vias. Other processes for completing the interconnect structure 1602 are, however, amenable. The single and dual damascene processes may, for example, be performed as described with regard to FIG. 16.

Figure 19:
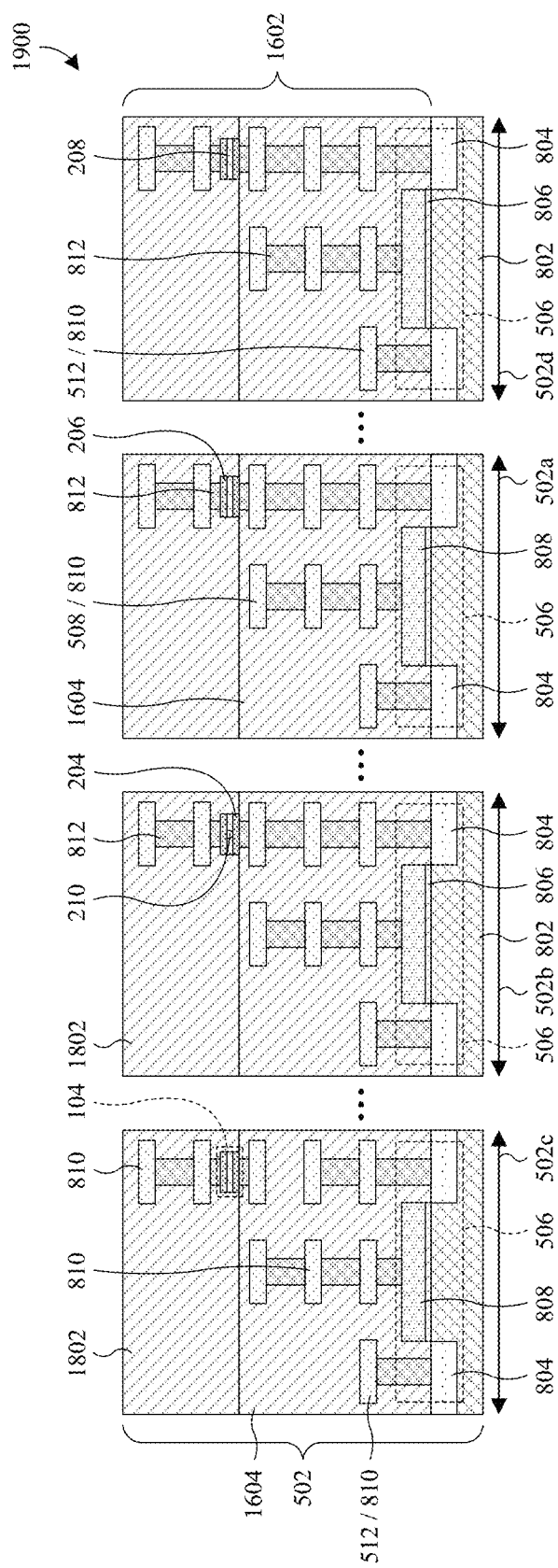

As illustrated by the cross-sectional view 1900 of FIG. 19, the magnetic junction at the OTP portion 502b is broken down to form defects 210 in the barrier element 208. The defects may, for example, be or comprise a conductive filament or some other suitable defects. In some embodiments, break down is performed by applying a high voltage across the magnetic junction at the OTP portion 502b. In some embodiments, the breakdown voltage causes hard breakdown and/or irreversible breakdown of the barrier element 208, such that the broken-down state of the barrier element 208 is not affected by high temperatures, such as those temperatures during reflow processes. In some embodiments, other memory cells (not shown) at the OTP portion 502b are not broken down and are hence left in an unbroken-down state.

The method illustrated by FIGS. 15-19 may, for example, be employed to form the integrated chip in any one of FIGS. 1, 4A-4C, 5, 6A, 6B, 7, 9A, 9B, 12A-12D, 13A-13D, 14A, and 14B. While the cross-sectional views 1500-1900 shown in FIGS. 15-19 are described with reference to the method, it will be appreciated that the structures shown in FIGS. 15-19 are not limited to the method and may stand alone without the method.

Figure 20:
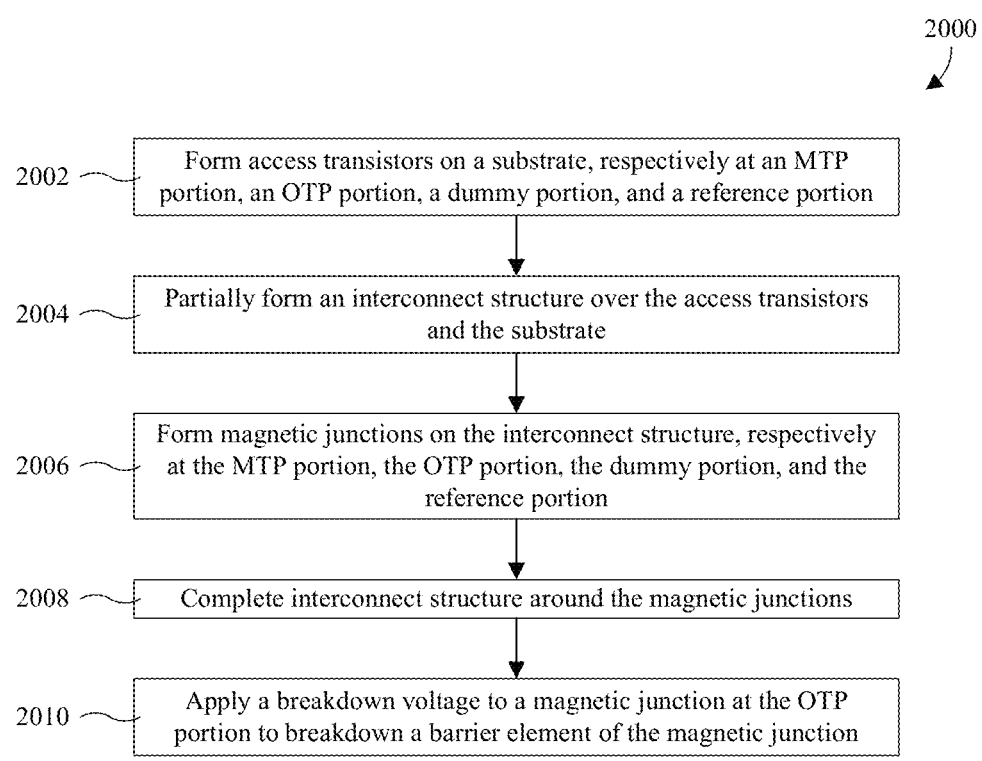
FIG. 20 illustrates a block diagram of some embodiments of the method of FIGS. 15-19.

With reference to FIG. 20, a block diagram 2000 of some embodiments of the method of FIGS. 15-19 is provided.

At 2002, access transistors are formed on a substrate, respectively at an MTP portion, an OTP portion, a dummy portion, and a reference portion. See, for example, FIG. 15.

At 2004, an interconnect structure is partially formed over the access transistors and the substrate. See, for example, FIG. 16.

At 2006, magnetic junctions are formed on the interconnect structure, respectively at the MTP portion, the OTP portion, the dummy portion, and the reference portion. See, for example, FIG. 17.

At 2008, the interconnect structure is completed around the magnetic junctions. See, for example, FIG. 18.

At 2010, a breakdown voltage is applied to a magnetic junction at the OTP portion to breakdown a barrier element of the magnetic junction. See, for example, FIG. 19.

While the block diagram 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an integrated chip including: an array including a plurality of magnetic junctions in a plurality of columns and a plurality of rows, wherein the plurality of magnetic junctions includes a first magnetic junction and a second magnetic junction, and wherein the first and second magnetic junctions include individual top ferromagnetic elements and individual bottom ferromagnetic elements, and further include individual barrier elements between the top and bottom ferromagnetic elements; wherein a first barrier element of the first magnetic junction electrically separates first top and bottom ferromagnetic elements of the first magnetic junction, and wherein a second barrier element of the second magnetic junction includes defects defining a leakage path between second top and bottom ferromagnetic elements of the second magnetic junction. In some embodiments, the first magnetic junction is offset from an edge of the array and the second magnetic junction is at an edge of the array. In some embodiments, the integrated chip further includes: an access transistor having a first source/drain electrically coupled to the second bottom ferromagnetic element of the second magnetic junction; and a pair of conductive lines extending along a column of the array in which the second magnetic junction is located, wherein the conductive lines are respectively and electrically coupled to a second source/drain of the access transistor and the second top ferromagnetic element of the second magnetic junction. In some embodiments, the integrated chip further includes a second access transistor electrically coupled in parallel with the access transistor. In some embodiments, the first and second magnetic junctions have the same width. In some embodiments, the first barrier element of the first magnetic junction has a top surface that is flat, wherein the second barrier element of the second magnetic junction has a top surface that is curved. In some embodiments, the plurality of magnetic junctions includes a third magnetic junction in the same column of the array as the second magnetic junction, wherein the integrated chip further includes an access transistor directly under the third magnetic junction and electrically separated from the third magnetic junction. In some embodiments, the plurality of magnetic junctions further includes a third magnetic junction, wherein the integrated chip further includes: a reference circuit configured to generate a reference current by averaging individual currents flowing across the first and second magnetic junctions; and a sense amplifier configured to compare the reference current to a read current flowing across the third magnetic junction. In some embodiments, the third magnetic junction includes a third top ferromagnetic element and a third bottom ferromagnetic element, and further includes a third barrier element between the third top and bottom ferromagnetic elements, wherein the third top ferromagnetic element includes defects defining a leakage path between the third top and bottom ferromagnetic elements. In some embodiments, the third magnetic junction includes a third top ferromagnetic element and a third bottom ferromagnetic element, and further includes a third barrier element between the third top and bottom ferromagnetic elements, wherein the third barrier element electrically separates the third top and bottom ferromagnetic elements.

In some embodiments, the present application provides a method for forming an integrated chip, the method including: forming an array including multiple magnetic junctions in a plurality of rows and a plurality of columns, wherein the magnetic junctions include individual top ferromagnetic elements and individual bottom ferromagnetic elements, and further include individual barrier elements separating the top and bottom ferromagnetic elements; and applying a breakdown voltage individually across first magnetic junctions in a first portion of the array, but not a second portion of the array, wherein the breakdown voltage damages barrier elements of the first magnetic junctions to define leakage paths between top and bottom ferromagnetic elements of the first magnetic junctions. In some embodiments, the applying is performed at temperatures in excess of about 100 degrees Celsius. In some embodiments, the forming of the array includes: depositing a bottom ferromagnetic layer; depositing a barrier layer on the bottom ferromagnetic layer; depositing a top ferromagnetic layer on the barrier layer; and patterning the bottom ferromagnetic layer, the barrier layer, and the top ferromagnetic layer into the array. In some embodiments, the first portion of the array is at an edge of the array and the second portion of the array is fully offset from each edge of the array.

In some embodiments, the present application provides a method for reading a memory array, the method including: providing an array including multiple magnetic junctions in a plurality of rows and a plurality of columns, wherein the magnetic junctions include individual top ferromagnetic elements and individual bottom ferromagnetic elements, and further include individual barrier elements between the top and bottom ferromagnetic elements; generating a reference current by averaging a first current through a first magnetic junction of the array and a second current through a second magnetic junction of the array; and comparing a read current through a third magnetic junction in the array to the reference current to sense a state of the third magnetic junction, wherein a barrier element of the first magnetic junction electrically separates top and bottom ferromagnetic elements of the first magnetic junction, and wherein a barrier element of the second magnetic junction includes defects defining a leakage path between top and bottom ferromagnetic elements of the second magnetic junction. In some embodiments, the top and bottom ferromagnetic elements of the first magnetic junction have parallel magnetizations. In some embodiments, the top and bottom ferromagnetic elements of the first magnetic junction have anti-parallel magnetizations. In some embodiments, a barrier element of the third magnetic junction electrically separates top and bottom ferromagnetic elements of the third magnetic junction. In some embodiments, a barrier element of the third magnetic junction includes defects defining a leakage path between top and bottom ferromagnetic elements of the third magnetic junction. In some embodiments, the method further includes: biasing a word line extending along a row of the array to select the row, wherein the second magnetic junction is in the row; and biasing a bit line extending along a column of the array to generate the second current at a source line extending along the column, wherein the second magnetic junction is in the column.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
    an array comprising a plurality of magnetic junctions in a plurality of columns and a plurality of rows, wherein the plurality of magnetic junctions comprises a first magnetic junction, second magnetic junction, and a third magnetic junction, and wherein the first and second magnetic junctions comprise individual top ferromagnetic elements and individual bottom ferromagnetic elements, and further comprise individual barrier elements between the top and bottom ferromagnetic elements; and
    an access transistor directly under the third magnetic junction and electrically separated from the third magnetic junction;
    wherein a first barrier element of the first magnetic junction electrically separates first top and bottom ferromagnetic elements of the first magnetic junction, and wherein a second barrier element of the second magnetic junction comprises defects defining a leakage path between second top and bottom ferromagnetic elements of the second magnetic junction.

2. The integrated chip according to claim 1, wherein the first magnetic junction is offset from an edge of the array and the second magnetic junction is at an edge of the array.

3. The integrated chip according to claim 1, further comprising:
    a second access transistor having a first source/drain electrically coupled to the second bottom ferromagnetic element of the second magnetic junction; and
    a pair of conductive lines extending along a column of the array in which the second magnetic junction is located, wherein the conductive lines are respectively and electrically coupled to a second source/drain of the second access transistor and the second top ferromagnetic element of the second magnetic junction.

4. The integrated chip according to claim 3, further comprising:
    a third access transistor electrically coupled in parallel with the access transistor.

5. The integrated chip according to claim 1, wherein the first and second magnetic junctions have the same width.

6. The integrated chip according to claim 1, wherein the first barrier element of the first magnetic junction has a top surface that is flat, and wherein the second barrier element of the second magnetic junction has a top surface that is curved.

7. The integrated chip according to claim 1, wherein the third magnetic junction is in the same column of the array as the second magnetic junction.

8. An integrated chip comprising:
    an array comprising a plurality of magnetic junctions in a plurality of columns and a plurality of rows, wherein the plurality of magnetic junctions comprises a first magnetic junction, a second magnetic junction, and a third magnetic junction, and wherein the first and second magnetic junctions comprise individual top ferromagnetic elements and individual bottom ferromagnetic elements, and further comprise individual barrier elements between the top and bottom ferromagnetic elements;
    a reference circuit configured to generate a reference current by averaging individual currents flowing across the first and second magnetic junctions; and
    a sense amplifier configured to compare the reference current to a read current flowing across the third magnetic junction;
    wherein a first barrier element of the first magnetic junction electrically separates first top and bottom ferromagnetic elements of the first magnetic junction, and wherein a second barrier element of the second magnetic junction comprises defects defining a leakage path between second top and bottom ferromagnetic elements of the second magnetic junction.

9. The integrated chip according to claim 8, wherein the third magnetic junction comprises a third top ferromagnetic element and a third bottom ferromagnetic element, and further comprises a third barrier element between the third top and bottom ferromagnetic elements, and wherein the third top ferromagnetic element comprises defects defining a leakage path between the third top and bottom ferromagnetic elements.

10. The integrated chip according to claim 8, wherein the third magnetic junction comprises a third top ferromagnetic element and a third bottom ferromagnetic element, and further comprises a third barrier element between the third top and bottom ferromagnetic elements, and wherein the third barrier element electrically separates the third top and bottom ferromagnetic elements.

11. The integrated chip according to claim 8, wherein the first magnetic junction is offset from an edge of the array and the second magnetic junction is at an edge of the array.

12. The integrated chip according to claim 8, wherein the first and second magnetic junctions have the same width.

13. The integrated chip according to claim 8, wherein the first barrier element of the first magnetic junction has a top surface that is flat, and wherein the second barrier element of the second magnetic junction has a top surface that is curved.

14. The integrated chip according to claim 8, further comprising:
- an access transistor having a first source/drain electrically coupled to the second bottom ferromagnetic element of the second magnetic junction; and
- a pair of conductive lines extending along a column of the array in which the second magnetic junction is located, wherein the conductive lines are respectively and electrically coupled to a second source/drain of the access transistor and the second top ferromagnetic element of the second magnetic junction.

15. A method for reading a memory array, the method comprising:
- providing an array comprising multiple magnetic junctions in a plurality of rows and a plurality of columns, wherein the magnetic junctions comprise individual top ferromagnetic elements and individual bottom ferromagnetic elements, and further comprise individual barrier elements between the top and bottom ferromagnetic elements;
- generating a reference current by averaging a first current through a first magnetic junction of the array and a second current through a second magnetic junction of the array; and
- comparing a read current through a third magnetic junction in the array to the reference current to sense a state of the third magnetic junction,
    wherein a barrier element of the first magnetic junction electrically separates top and bottom ferromagnetic elements of the first magnetic junction, and wherein a barrier element of the second magnetic junction comprises defects defining a leakage path between top and bottom ferromagnetic elements of the second magnetic junction.

16. The method according to claim 15, wherein the top and bottom ferromagnetic elements of the first magnetic junction have parallel magnetizations.

17. The method according to claim 15, wherein the top and bottom ferromagnetic elements of the first magnetic junction have anti-parallel magnetizations.

18. The method according to claim 15, wherein a barrier element of the third magnetic junction electrically separates top and bottom ferromagnetic elements of the third magnetic junction.

19. The method according to claim 15, wherein a barrier element of the third magnetic junction comprises defects defining a leakage path between top and bottom ferromagnetic elements of the third magnetic junction.

20. The method according to claim 15, further comprising:
- biasing a word line extending along a row of the array to select the row, wherein the second magnetic junction is in the row; and
- biasing a bit line extending along a column of the array to generate the second current at a source line extending along the column, wherein the second magnetic junction is in the column.

* * * * *